United States Patent
Lu et al.

(10) Patent No.: US 12,205,540 B2
(45) Date of Patent: Jan. 21, 2025

(54) SHIFT REGISTER UNIT AND DRIVING METHOD THEREOF, GATE DRIVING CIRCUIT, AND DISPLAY PANEL

(71) Applicant: BOE Technology Group Co., Ltd., Beijing (CN)

(72) Inventors: Jiangnan Lu, Beijing (CN); Guangliang Shang, Beijing (CN); Xinshe Yin, Beijing (CN); Libin Liu, Beijing (CN); Jianchao Zhu, Beijing (CN); Hao Zhang, Beijing (CN); Ke Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 242 days.

(21) Appl. No.: 17/764,395

(22) PCT Filed: Mar. 18, 2021

(86) PCT No.: PCT/CN2021/081499
§ 371 (c)(1),
(2) Date: Mar. 28, 2022

(87) PCT Pub. No.: WO2022/193222
PCT Pub. Date: Sep. 22, 2022

(65) Prior Publication Data
US 2023/0343285 A1 Oct. 26, 2023

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC .............. G09G 3/3233; G09G 3/3258; G09G 3/3266; G09G 3/36; G09G 2230/00;
(Continued)

(56) References Cited

U.S. PATENT DOCUMENTS

| | | | |
|---|---|---|---|
| 9,852,695 B2 | 12/2017 | Choi | |
| 10,607,534 B2 * | 3/2020 | Tian | ..................... H10K 59/352 |
| 10,777,142 B2 | 9/2020 | Yuan et al. | |
| 10,923,008 B2 | 2/2021 | Feng et al. | |
| 10,964,243 B2 | 3/2021 | Yuan et al. | |
| 11,200,825 B2 | 12/2021 | Feng et al. | |

(Continued)

FOREIGN PATENT DOCUMENTS

| | | |
|---|---|---|
| CN | 107316603 A | 11/2017 |
| CN | 108648716 A | 10/2018 |

(Continued)

*Primary Examiner* — Nitin Patel
*Assistant Examiner* — Cory A Almeida
(74) *Attorney, Agent, or Firm* — Banner & Witcoff, Ltd.

(57) ABSTRACT

A shift register unit, a driving method thereof, a gate driving circuit and a display panel are provided. The shift register unit includes an input circuit, a reset circuit, a first output circuit and a second output circuit; the input circuit is configured to control a level of a first node in response to a first input signal; the reset circuit is configured to reset the first node in response to a reset signal; the first output circuit is configured to output a shift signal under control of the level of the first node; and the second output circuit is configured to, in a first phase, under control of the level of the first node, output a plurality of sub-pulses at the first output terminal as a first output signal in a case where the shift output terminal outputs a first level of the shift signal.

17 Claims, 8 Drawing Sheets

(51) Int. Cl.
*G09G 3/3266* (2016.01)
*G09G 3/36* (2006.01)
*G11C 19/28* (2006.01)

(52) U.S. Cl.
CPC .............. *G09G 3/36* (2013.01); *G11C 19/28* (2013.01); *G09G 2230/00* (2013.01); *G09G 2300/0842* (2013.01); *G09G 2310/0224* (2013.01); *G09G 2310/0286* (2013.01); *G09G 2310/061* (2013.01); *G09G 2310/08* (2013.01); *G09G 2320/0295* (2013.01); *G09G 2320/045* (2013.01)

(58) Field of Classification Search
CPC .............. G09G 2300/0842; G09G 2310/0224; G09G 2310/0286; G09G 2310/061; G09G 2310/08; G09G 2320/0295; G09G 2320/045; G11C 19/28
See application file for complete search history.

(56) References Cited

U.S. PATENT DOCUMENTS

| | | | |
|---|---|---|---|
| 11,263,942 B2 | 3/2022 | Feng et al. | |
| 11,328,672 B2 | 5/2022 | Feng et al. | |
| 2019/0066599 A1 | 2/2019 | Kim et al. | |
| 2020/0219428 A1 | 7/2020 | Yuan et al. | |
| 2021/0201806 A1* | 7/2021 | Feng | G11C 19/28 |
| 2021/0201810 A1 | 7/2021 | Feng et al. | |

FOREIGN PATENT DOCUMENTS

| | | | | |
|---|---|---|---|---|
| CN | 108877627 A | 11/2018 | | |
| CN | 109036282 A | 12/2018 | | |
| CN | 109410825 A | 3/2019 | | |
| CN | 109658865 A | * 4/2019 | ........... | G09G 3/3208 |
| CN | 109920387 A | 6/2019 | | |
| CN | 109935212 A | 6/2019 | | |
| KR | 1020150069804 A | 6/2015 | | |

* cited by examiner

SHIFT REGISTER UNIT AND DRIVING METHOD THEREOF, GATE DRIVING CIRCUIT, AND DISPLAY PANEL

The application is a U.S. National Phase Entry of International Application No. PCT/CN2021/081499 filed on Mar. 18, 2021, designating the United States of America. The present application claims priority to and the benefit of the above-identified application and the above-identified application is incorporated by reference herein in its entirety.

TECHNICAL FIELD

The embodiments of the present disclosure relate to a shift register unit and a driving method thereof, a gate driving circuit, and a display panel.

BACKGROUND

In the field of display technology, for example, a pixel array of a liquid crystal display panel or an organic light-emitting diode (OLED) display panel usually includes a plurality of rows of gate lines and a plurality of columns of data lines interlaced with the gate lines. The driving of the gate lines can be implemented by a bonded integrated driving circuit. In recent years, with the continuous improvement of the manufacturing process of amorphous silicon thin film transistors or oxide thin film transistors, a gate line driving circuit can also be directly integrated on the thin film transistor array substrate to form a GOA (Gate driver On Array) to drive the gate lines. For example, a GOA including a plurality of cascaded shift register units can be used to provide on-off voltage signals (scan signals) for the plurality of rows of the gate lines of the pixel array, so as to control the plurality of rows of the gate lines to be turned on in sequence, for example, and at the same time, the data lines are used to provide data signals to the pixel units of the corresponding row in the pixel array, so as to form the gray-scale voltages required for displaying the respective gray-scales of the image in respective pixel units, thereby displaying a frame of image.

SUMMARY

At least one embodiment of the present disclosure discloses a shift register unit, comprising: an input circuit, a reset circuit, a first output circuit, and a second output circuit; the input circuit is coupled to a first node and is configured to control a level of the first node in response to a first input signal; the reset circuit is coupled to the first node and a reset terminal, and is configured to reset the first node in response to a reset signal provided by the reset terminal; the first output circuit is coupled to the first node and at least one shift output terminal, and is configured to output a shift signal at the shift output terminal under control of the level of the first node; and the second output circuit is coupled to the first node and at least one first output terminal, and is configured to, in a first phase, under control of the level of the first node, output a plurality of sub-pulses at the first output terminal as a first output signal in a case where the shift output terminal outputs a first level of the shift signal.

For example, in the shift register unit provided by at least one embodiment of the present disclosure, the second output circuit is further configured to, in a second phase different from the first phase, under control of the level of the first node, output a pulse signal or an invalid signal at the first output terminal as the first output signal in a case where the shift output terminal outputs the first level of the shift signal.

For example, in the shift register unit provided by at least one embodiment of the present disclosure, a pulse width of the pulse signal is identical with a width of the first level of the shift signal.

For example, the shift register unit provided by at least one embodiment of the present disclosure, further comprises a third output circuit, the third output circuit is coupled to the first node and at least one second output terminal, and is configured to, under control of the level of the first node, output a second output signal at the second output terminal in a case where the first output terminal outputs a first sub-pulse of the plurality of sub-pulses.

For example, in the shift register unit provided by at least one embodiment of the present disclosure, a pulse width of the second output signal is identical with a pulse width of a single sub-pulse of the first output signal.

For example, in the shift register unit provided by at least one embodiment of the present disclosure, the third output circuit is further configured to, in the second phase, under control of the level of the first node, output a pulse signal at the second output terminal as the second output signal in a case where the shift output terminal outputs the first level of the shift signal.

For example, in the shift register unit provided by at least one embodiment of the present disclosure, in a case of comprising one shift output terminal, the first output circuit comprises: a first transistor, wherein a gate electrode of the first transistor is coupled to the first node, a first electrode of the first transistor is coupled to a first clock signal terminal to receive a first clock signal, and a second electrode of the first transistor is coupled to the shift output terminal; and a first capacitor, wherein a first electrode of the first capacitor is coupled to the first node, and a second electrode of the first capacitor is coupled to the shift output terminal.

For example, in the shift register unit provided by at least one embodiment of the present disclosure, in a case of comprising one first output terminal, the second output circuit comprises: a second transistor, wherein a gate electrode of the second transistor is coupled to the first node, a first electrode of the second transistor is coupled to a second clock signal terminal to receive a second clock signal, and a second electrode of the second transistor is coupled to the first output terminal; and a second capacitor, wherein a first electrode of the second capacitor is coupled to the first node, and a second electrode of the second capacitor is coupled to the first output terminal.

For example, in the shift register unit provided by at least one embodiment of the present disclosure, each cycle of the second clock signal comprises a first period corresponding to the first level of the shift signal and a second period corresponding to a second level of the shift signal; in the first phase, the first period comprises the plurality of sub-pulses, and in the second phase, the first period comprises a pulse signal or an invalid signal; and a level at the second period remains unchanged.

For example, in the shift register unit provided by at least one embodiment of the present disclosure, in a case of comprising one second output terminal, the third output circuit comprises: a third transistor, wherein a gate electrode of the third transistor is coupled to the first node, a first electrode of the third transistor is coupled to a third clock signal terminal to receive a third clock signal, and a second electrode of the third transistors is coupled to the second output terminal; and a third capacitor, wherein a first electrode of the third capacitor is coupled to the first node, and a second electrode of the third capacitor is coupled to the second output terminal.

For example, in the shift register unit provided by at least one embodiment of the present disclosure, in the first phase, a pulse width of each cycle of the third clock signal is identical with a width of a single sub-pulse of the plurality of sub-pulses; and in the second phase, a pulse width of each cycle of the third clock signal is identical with a pulse width of the shift signal.

At least one embodiment of the present disclosure also provides a gate driving circuit including the shift register unit provided by any embodiment of the present disclosure.

At least one embodiment of the present disclosure also provides a display panel, comprising the gate driving circuit provided by any embodiment of the present disclosure and pixel units arranged in an array; each pixel unit comprises a sensing circuit and a light-emitting element, the at least one first output terminal of the second output circuit of the shift register unit is coupled to a sensing circuit of at least one row of the pixel units corresponding the at least one first output terminal, so that the sensing circuit performs a sensing operation in response to the first output signal.

For example, in the display panel provided by at least one embodiment of the present disclosure, each pixel unit further comprises a driving circuit, in a case where the shift register unit further comprises a third output circuit, the third output circuit is coupled to the first node and at least one second output terminal, and is configured to, under control of the level of the first node, output a second output signal at the second output terminal in a case where the first output terminal outputs a first sub-pulse of the plurality of sub-pulses; and the at least one second output terminal of the third output circuit of the shift register unit is coupled to a driving circuit of at least one row of the pixel units corresponding the at least one second output terminal, so that the driving circuit controls a current flowing through the light-emitting element in response to the second output signal.

At least one embodiment of the present disclosure also provides a driving method for the shift register unit, comprising: applying the first input signal to the input circuit, so that the input circuit controls the level of the first node in response to the first input signal; applying the reset signal to the reset circuit, so that the reset circuit resets the first node in response to the reset signal; under control of the level of the first node, the first output circuit outputting the shift signal at the at least one shift output terminal; and in the first phase, under control of the level of the first node, the second output circuit outputting the plurality of sub-pulses at the first output terminal as the first output signal in the case where the shift output terminal outputs the first level of the shift signal.

For example, the driving method of shift register unit provided by at least one embodiment of the present disclosure, further comprises: in a second phase different from the first phase, under control of the level of the first node, the second output circuit outputting a pulse signal or an invalid signal at the first output terminal as the first output signal in a case where the shift output terminal outputs the first level of the shift signal.

For example, the driving method of shift register unit provided by at least one embodiment of the present disclosure, comprises a plurality of first phases, and the driving method further comprises: in an n-th first phase, under control of the level of the first node, the second output circuit outputting a plurality of sub-pulses at the first output terminal as the first output signal in a case where the shift output terminal outputs the first level of the shift signal; and in an m-th first phase, under control of the level of the first node, the second output circuit outputting a plurality of sub-pulses at the first output terminal as the first output signal in a case where the shift output terminal outputs the first level of the shift signal, a count of the plurality of sub-pulses output in the n-th first phase is different from a count of the plurality of sub-pulses output in the m-th first phase; where n is an integer greater than or equal to 1 and m is an integer greater than or equal to 1.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
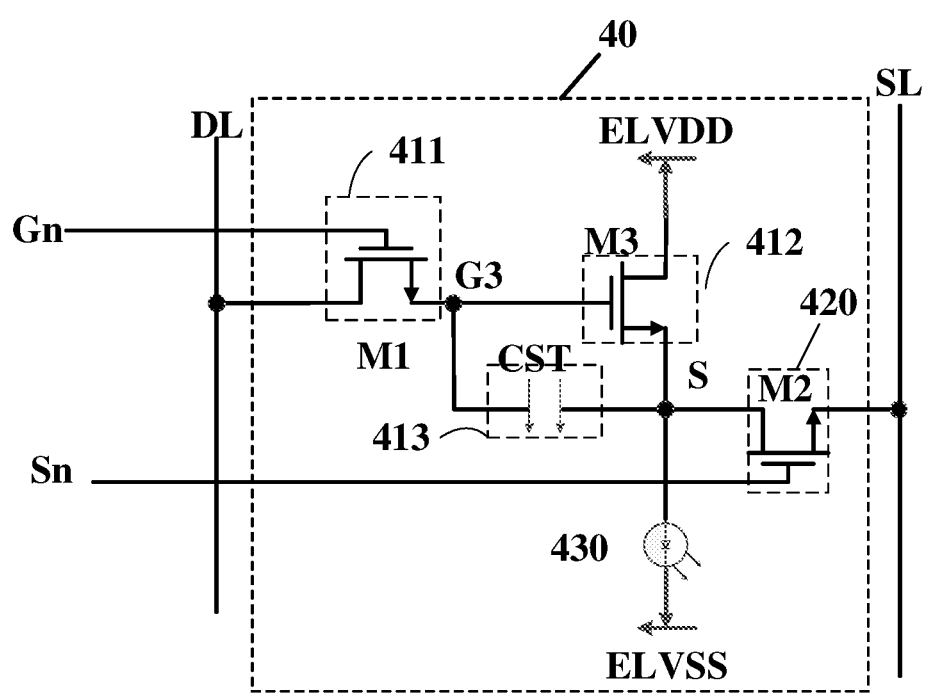
FIG. 1A is a diagram of a circuit structure of a pixel unit.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be explained by several specific examples. In order to keep the following description of embodiments of the present disclosure clear and concise, detailed descriptions of known functions and known components can be omitted. When any component of an embodiment of the present invention appears in more than one drawing, the component is indicated by the same reference number in each drawing.

In a general OLED display panel, compensation technology is required to improve display quality. When compensating a pixel unit in the OLED display panel, in addition to arranging a pixel compensation circuit in the pixel unit to perform internal compensation, external compensation can also be performed by arranging a sensing transistor. When performing external compensation, a gate driving circuit composed of shift register units needs to provide driving signals respectively for a scan transistor and the sensing transistor to the pixel unit in the display panel. For example, a scan driving signal (i.e., a display output signal) for the scan transistor is provided in the display period (Display) of one frame, and a sensing driving signal (i.e., a blank output signal) for the sensing transistor is provided in the blank period (Blank) of one frame.

FIG. 1A is a diagram of a circuit structure of a pixel unit.

For example, the pixel unit 40 comprises a data writing circuit 411, a driving circuit 412, a charge storage circuit 413, and a sensing circuit 420. For example, as shown in FIG. 1A, the data writing circuit may be implemented as a scan transistor M1, the driving circuit 412 may be implemented as a driving transistor M3, the sensing circuit 420 may be implemented as a sensing transistor M2, and the charge storage circuit 413 may be implemented as a storage capacitor CST. The transistors in the pixel unit 40 are described in detail below by taking the pixel unit in the first row as an example.

A gate electrode of the scan transistor M1 is configured to receive a scan driving signal, for example, a gate electrode of the scan transistor M1 is coupled to a first gate line Gn (i.e., the gate line coupled to a first output terminal of a shift register unit) so as to receive the scan driving signal; a first electrode of the scan transistor M1 is configured to receive a data signal, for example, the first electrode of the scan transistor M1 is coupled to a data line DL so as to receive the data signal; a second electrode of the scan transistor M1 is coupled to a gate (G3) electrode of the driving transistor M3.

A first electrode of the driving transistor M3 is configured to receive a first driving voltage ELVDD for generating a driving current, and a second electrode (S) of the driving transistor M3 and a first electrode of the sensing transistor M2 are coupled.

A gate electrode of the sensing transistor M2 is configured to receive a sensing driving signal, for example, the gate electrode of the sensing transistor M2 is coupled to a second gate line Sn (i.e., the gate line coupled to a second output terminal of the shift register unit) so as to receive the sensing driving signal; a second electrode of the sensing transistor M2 is configured to receive a reference voltage signal or output a sensing voltage signal, for example, the second electrode of the sensing transistor M2 is coupled to a sensing line SL so as to receive the reference voltage signal (VREF) or output the sensing voltage signal.

A first electrode of the storage capacitor CST is coupled to the gate (G3) electrode of the driving transistor M3, and a second electrode of the storage capacitor CST is coupled to the second electrode (S) of the driving transistor M3. The storage capacitor CST may be used to maintain a voltage difference between the gate electrode (G3) and the second electrode (S) of the driving transistor M3.

For example, in some display panels, the light-emitting unit 430 may be implemented as an organic light-emitting diode (OLED) or a quantum dot light-emitting diode (QLED). The OLED is taken as an example for description below. For example, the OLED can be of various types, such as top emission, bottom emission, etc., and can emit red light, green light, blue light, or white light, etc., and the embodiments of the present disclosure are not limited to this case.

As shown in FIG. 1A, a first electrode of the light-emitting unit 430 is coupled to the second electrode (S) of the driving transistor M3, so as to receive the driving current of the driving transistor M3; a second electrode of the light-emitting unit 430 is configured to receive a second driving voltage ELVSS, for example, the second electrode of the light-emitting unit 430 is configured to be grounded, and in this case the second driving voltage ELVSS is 0V. For example, the first driving voltage ELVDD is a high-level voltage (e.g., 5V, 10V, or other suitable voltages), and the second driving voltage ELVSS is a low-level voltage (e.g., 0V, −5V, −10V, or other suitable voltages). In the case where the driving transistor M3 is turned on (or partially turned on), the first driving voltage ELVDD and the second driving voltage ELVSS can be regarded as a power source, and the power source is used to generate the driving current for driving the light-emitting unit 430.

External compensation can be achieved through the sensing transistor M2 in the pixel unit 40. For example, in the blank period of a certain frame, a sensing voltage signal may be obtained through the sensing transistor M2, and further data processing may be performed on the sensing voltage signal to obtain compensation information about the threshold voltage Vth and the current coefficient K; and then, in the display period of the next frame, the light-emitting unit 430 is driven according to the compensation information obtained above, thereby completing the external compensation of the pixel unit 40.

Figure 1B:
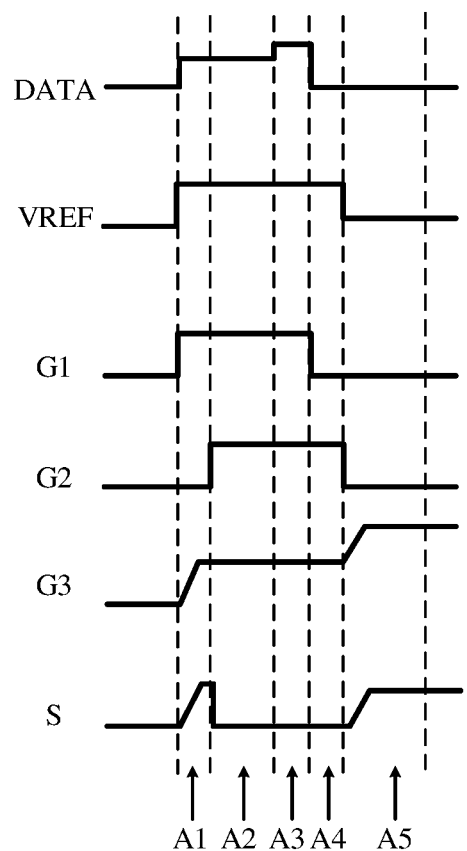
FIG. 1B is a signal timing diagram in a case where the pixel unit as shown in FIG. 1A operates in a display period of one frame.

FIG. 1B is a signal timing diagram when the pixel unit shown in FIG. 1A operates in a display period of one frame. The working principle of the pixel unit 40 shown in FIG. 1A in the display period of one frame will be described below in conjunction with the signal timing diagram shown in FIG. 1B, and each transistor is an N-type transistor as an example for description herein, that is, each transistor is turned on at a high level and turned off at a low level, but the embodiments of the present disclosure are not limited thereto. The signal levels in the signal timing diagram shown in FIG. 1B are only schematic and do not represent real level values.

In FIG. 1B, DATA represents the data signal received by the pixel unit 40 through the data line DL, VREF represents the reference voltage signal received by the pixel unit 40 through the sensing line SL, G1 represents the gate electrode of the scan transistor M1 in the pixel unit 40, G2 represents the gate electrode of the sensing transistor M2, G3 represents the gate electrode of the driving transistor M3, S represents the second electrode of the driving transistor M3, and A1-A5 respectively represent the first phase to the fifth phase when the pixel unit 40 in the first row operates in the display period.

As shown in FIG. 1A, in the A1 phase, G1 is at a high level, the scan transistor M1 is turned on; G2 is at a low level, the sensing transistor M2 is turned off. In this phase, the data signal in a non-current row is written through the data line DL, so the potential of the driving transistor M3 becomes high. Due to the bootstrapping effect of the storage capacitor CST, the potential of S also becomes high in this phase.

In the A2 phase, the potential of G2 changes from a low level to a high level, the sensing transistor M2 is turned on, and the scan transistor M1 is kept turned on. In this phase, the data signal of the non-current row is written through the data line DL, for example, the data signal can be the same as or different from the data signal written in the A1 phase; the reference voltage signal VREF is written through the sensing line SL, for example, the reference voltage signal VREF is a low level signal (for example, the low level is 0V).

In the A3 phase (the data writing phase), G1 and G2 are kept at a high level, so the scan transistor M1 and the sensing transistor M2 are kept turned on. In this phase, the data signal in a current row is written through the data line DL, for example, the data signal is a data signal, on which the external compensation is performed, for the pixel unit in the current row to emit light; the reference voltage signal VREF is written through the sensing line SL, for example, the reference voltage signal VREF may be the same as the reference voltage signal VREF written in the A2 phase.

In the A4 phase (holding phase), the potential of G1 changes from a high level to a low level, and the scan transistor M1 is turned off; G2 continues to maintain at a high level, and the sensing transistor M2 continues to be turned on. In this phase, the storage capacitor CST maintains the potentials of G3 and S unchanged.

In the A5 phase (light-emitting phase), G1 remains at a low level, and the scan transistor M1 is turned off; the potential of G2 changes from a high level to a low level, and the sensing transistor M2 is turned off. In this phase, the driving transistor T3 is turned on under the combined action of the potential of G3 and the potential of S (for example, the absolute value of the difference between the potential of G3 and the potential of S is greater than the threshold voltage Vth of the driving transistor M3), and the first driving voltage ELVDD charges the second electrode S of the driving transistor T3, that is, the light-emitting unit 430 is driven to emit light. At the same time, in the case where the potential of S increases, the potential of G3 also increases due to the bootstrapping effect of the storage capacitor CST.

So far, through the above five phases, the light-emitting unit 430 (e.g., OLED) in the pixel unit 40 can finish emitting light. It should be noted that, as shown in FIG. 1B, in this example, in the last ¼ period of the phases (the A1 phase, the A2 phase, and the A3 phase) in which G1 is at a high level, the pixel unit 40 writes the data signal in the current row. In addition, the duration when the potential of G1 (or G2) is at a high level is the pulse width of the gate driving signal output by the gate driving circuit, and the level of G1 (or G2) is the level of the gate driving signal output by the gate driving circuit.

Figure 1C:
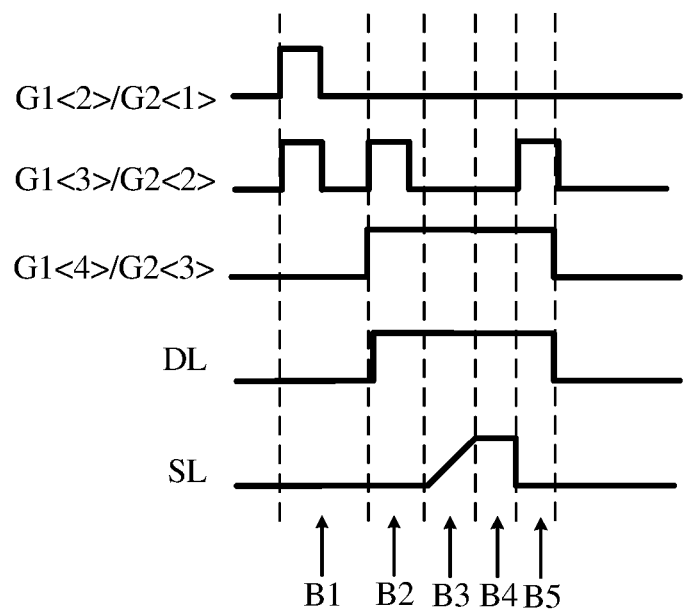
FIG. 1C is a signal timing diagram in a case where the pixel unit as shown in FIG. 1A operates in a blank period of one frame.

FIG. 1C is a signal timing diagram when the pixel unit shown in FIG. 1A operates in a blank period of one frame. The working principle of the pixel unit 40 shown in FIG. 1A in the blank period of one frame will be described below in conjunction with the signal timing diagram shown in FIG. 1C, and each transistor is an N-type transistor as an example for description herein, but the embodiments of the present disclosure are not limited thereto. The signal levels in the signal timing diagram shown in FIG. 1C are only schematic and do not represent real level values. For example, in the blank period of the frame, the pixel units of the third row are selected to be sensed.

In FIG. 1C, G1<2>/G2<1> represents the gate electrode of the scan transistor M1 of a pixel unit in a second row (or the gate electrode of the sensing transistor M2 of a pixel unit in a first row), G1<3>/G2<2> represents the gate electrode of the scan transistor M1 of a pixel unit in a third row (or the gate electrode of the sensing transistor M2 of a pixel unit in the second row), G1<4>/G2<3> represents the gate electrode of the scan transistor M1 of a pixel unit in a fourth row (or the gate electrode of the sensing transistor M2 of a pixel unit in the third row); DL represents the signal provided on the data line, SL represents the signal provided (or read out) on the sensing line, and B1-B5 respectively represent the first phase to the fifth phase when the pixel unit 40 in the third row operates in the blank period.

When sensing the pixel unit in the third row, first, a potential of the gate electrode G1<3> of the scan transistor M1 of the pixel unit in the third row and a potential of the gate electrode G2<3> of the sensing transistor M2 of the pixel unit in the third row need to be high, at the same time, because the gate electrode G2<2> of the sensing transistor M2 of the pixel unit in the second row is coupled to the gate electrode G1<3> of the scan transistor M1 of the pixel unit in the third row, at this time, the sensing transistor M2 of the pixel unit in the second row will be turned on, so that a sensing error occurs. Because the pixel unit in the second row is in the light-emitting phase, a current will flow through the driving transistor M3 of the pixel unit in the second row, which will charge the second electrode S of the driving transistor M3, at this time, the sensing line SL also senses the pixel units in the second row when sensing the pixel units in the third row, thereby causing the above-mentioned sensing error.

In order to avoid the above-mentioned sensing error, when sensing the pixel units in the third row, the driving transistors M3 of the pixel units in the second row need to be turned off first.

In the B1 phase (reset phase), the driving transistor M3 of the pixel unit in the second row is turned off. For example, in this phase, the potential of G1<2> and the potential of G2<2> are both high, so that the scan transistor M1 and the sensing transistor M2 of the pixel unit in the second row are turned on, and a correction potential is written to the gate electrode (G3) of the driving transistor M3 through the data line DL and the scan transistor M1, and the correction potential is also written to the second electrode (S) of the driving transistor M3 through the sensing line SL and the sensing transistor M2. For example, the correction potential is 0V, so that the driving transistor T3 of the pixel unit in the second row is turned off.

In the B2 phase (resetting phase), the potential of G1<3> and the potential of G2<3> are both high, so that the scan transistor M1 and the sensing transistor M2 of the pixel unit in the third row are turned on, a data signal (e.g., a high-level signal, such as 3.5V) is written to the gate electrode (G3) of the driving transistor M3 through the data line DL and the scan transistor M1, and a reference voltage signal (e.g., a low-level signal, such as 0V) is written to the second electrode (S) of the driving transistor M3 through the sensing line SL and the sensing transistor M2, so that the driving transistor M3 of the pixel unit in the third row is turned on. It should be noted that, in the B2 phase, the written data signal and the written reference voltage signal may be constant values, for example, are 3.5V and 0V, respectively.

In the B3 phase (charging phase), the potential of G1<3> changes from a high level to a low level, so that the scan transistor M1 of the pixel unit in the third row is turned off; the potential of G2<3> continues to maintain a high level, so that the sensing transistor M2 of the pixel unit in the third row remains to be turned on. The driving transistor M3 of the pixel unit in the third row continues to be turned on, so that the second electrode (S) of the driving transistor M3 is charged by the first driving voltage ELVDD. For example, in this phase, the sensing line SL can be in a floating state.

In the B3 phase, after a period of charging, the potential of the second electrode (S) of the driving transistor M3 remains basically unchanged, and then in the B4 phase (sensing phase), the potential, that is, a sensing voltage signal, of the second electrode (S) of the driving transistor M3 can be sensed through the sensing line SL, that is, the sensing voltage signal is output through the sensing line SL.

In the B5 phase (data write-back phase), the potential of G1<3> and the potential of G2<3> are both high, so that the scan transistor M1 and the sensing transistor M2 of the pixel unit in the third row are turned on, a data signal is written to the gate electrode (G3) of the driving transistor M3 through the data line DL and the scan transistor M1, and a reference voltage signal (for example, a low-level signal, for example, 0V) is written to the second electrode (S) of the driving transistor M3 through the sensing line SL and the sensing transistor M2, so that the driving transistor M3 of the pixel unit in the third row is turned on. For example, the data signal written in the B5 phase may be the same as the data signal used in the data writing phase (A3) in the display period.

As mentioned above, in the sensing phase B4 of the blank period, the pixel unit can only perform sensing once in response to the sensing signal, resulting in low sensing accuracy, therefore, how to increase the frequency of the sensing signal in the sensing phase to increase the number of sensing operations has become an urgent problem to be solved in the art. In addition, in the external compensation, it is necessary to output scan driving signals with different pulse widths and sensing driving signals with a low frequency and a high frequency. However, the existing driving circuit implements the above functions through two sets of circuits respectively, the signal synchronization is poor, and the frame is large.

At least one embodiment of the present disclosure provides a shift register unit including: an input circuit, a reset circuit, a first output circuit, and a second output circuit. The input circuit is coupled to a first node and is configured to control a level of the first node in response to a first input signal; the reset circuit is coupled to the first node and a reset terminal, and is configured to reset the first node in response to a reset signal provided by the reset terminal; the first output circuit is coupled to the first node and at least one shift output terminal, and is configured to output a shift signal at the shift output terminal under control of the level of the first node; and the second output circuit is coupled to the first node and at least one first output terminal, and is configured to, in a first phase, under control of the level of the first node, output a plurality of sub-pulses at the first output terminal as a first output signal when the shift output terminal outputs a first level of the shift signal.

At least one embodiment of the present disclosure further provides a gate driving circuit corresponding to the above-mentioned shift register unit, a display panel, and a driving method of the shift register unit.

The shift register unit provided by the embodiments of the present disclosure can output sensing driving signals with different pulse widths and frequencies at the same time, which can increase the number of times of sensing the electrical signal of the light-emitting unit, so that the sensing accuracy can be improved, and the circuit structure is beneficial to the implementation of a narrow frame.

The embodiments of the present disclosure and some examples thereof will be described in detail below with reference to the accompanying drawings.

Figure 2:
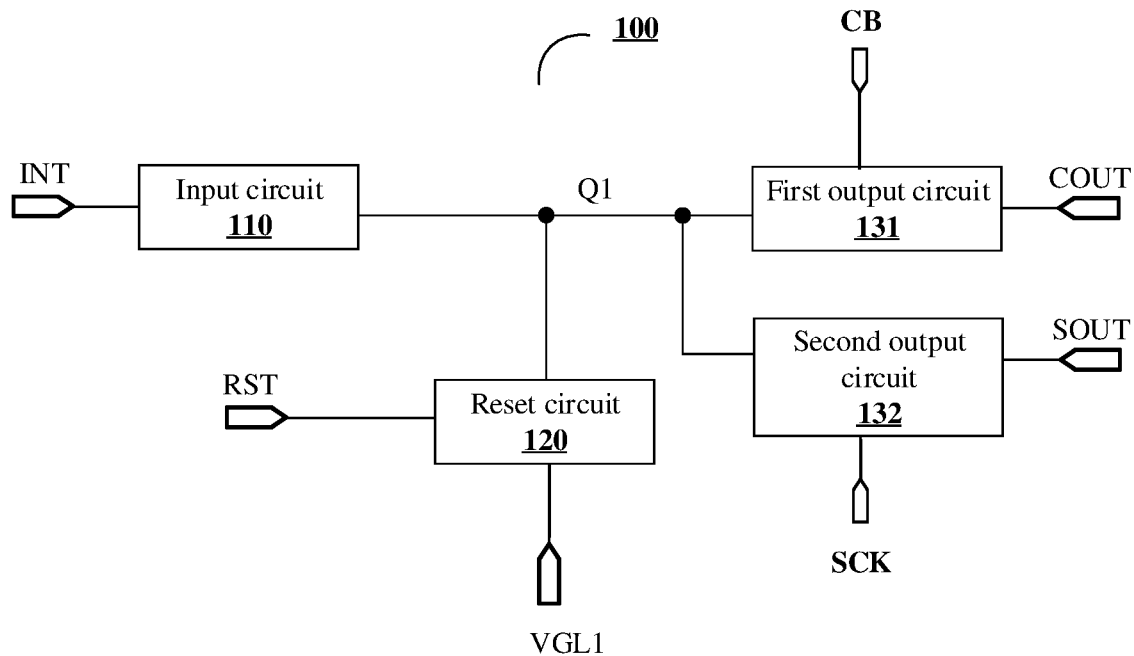
FIG. 2 is a schematic diagram of a shift register unit according to at least one embodiment of the present disclosure.

FIG. 2 is a schematic diagram of a shift register unit according to an embodiment of the present disclosure. As shown in FIG. 2, the shift register unit 100 includes an input circuit 110, a reset circuit 120, a first output circuit 131, and a second output circuit 132. A gate driving circuit can be obtained by cascading a plurality of shift register units 100, and the gate driving circuit is used to drive a display panel, such as a liquid crystal display panel and an organic light-emitting diode display panel, and sequentially provides scan signals to a plurality of gate lines of the display panel, so as to perform progressive or interlaced scanning, etc., during the period when the display panel displays one frame of pictures.

For example, as shown in FIG. 2, the input circuit 110 is coupled to the first node Q1 (e.g., a pull-up node here), and is configured to control the level of the first node Q1 in response to the first input signal. For example, in some examples, the input circuit 110 is coupled to an input terminal INT, a first voltage terminal (not shown in the figure, e.g., a high voltage terminal), and the first node Q1, and is configured to be turned on under control of an input signal provided by the input terminal INT, so as to couple the input terminal INT or the first voltage terminal to the first node Q1, so that the input signal provided by the input terminal INT or a high-level signal provided by the first voltage terminal is input to the first node Q1 to charge (e.g., pull up) the potential of the first node Q1 to an operating potential (valid level).

For example, the reset circuit 120 is coupled to the first node Q1 and a reset terminal RST, and is configured to reset the first node Q1 in response to a reset signal provided by the reset terminal RST. For example, the reset circuit 120 may be configured to be coupled to the first node Q1, a second voltage terminal VGL (e.g., providing a low level) or a separately provided voltage terminal (e.g., a low voltage terminal), and the reset terminal RST, so that the reset circuit 120 can electrically couple the first node Q1 with the second voltage terminal VGL or the low voltage terminal under the control of the reset signal input from the reset terminal RST, so as to perform pull-down reset on the first node Q1.

For example, the first output circuit 131 is coupled to the first node Q1 and at least one shift output terminal COUT, and is configured to output a shift signal at the shift output terminal COUT under the control of the level of the first node Q1. For example, in some examples, the first output circuit 131 is coupled to a first clock signal terminal CB, the first node Q1, and the shift output terminal COUT (only one shift output terminal COUT is shown in FIG. 2), and is configured to be turned on under the control of the level of the first node Q1, to transmit a first clock signal provided by the first clock signal terminal CB to the shift output terminal COUT, and to output the first clock signal at the shift output terminal COUT as a shift output signal.

For example, the second output circuit 132 is coupled to the first node Q1 and at least one first output terminal (SOUT), and is configured to, in a first phase (e.g., the blank period shown in FIG. 1C), under control of the level of the first node Q1, output a plurality of sub-pulses at the first output terminal SOUT as a first output signal when the shift output terminal COUT outputs a first level (such as, a high level) of the shift signal. For example, the first output signal SOUT-n shown in FIG. 4B has a plurality of sub-pulses in the output phase t3, so that the frequency of the first output signal can be increased, thereby increasing the number of sensing times of the sensing transistor M2 and improving the sensing accuracy. For example, in some examples, the second output circuit 132 is coupled to a second clock signal terminal SCK, the first node Q1, and the first output terminal SOUT (FIG. 2 only schematically shows one first output terminal SOUT, a plurality of first output terminals SOUT may be included, and the embodiments of the present disclosure are not limited to this case), and is configured to be turned on under the control of the level of the first node Q1, transmit a second clock signal provided by the second clock signal terminal SCK to the first output terminal SOUT, and output the second clock signal as a sensing driving signal at the first output terminal SOUT.

For example, the plurality of sub-pulses output by the first output terminal SOUT are input to the gate electrode of the sensing transistor M2 shown in FIG. 1A as a sensing driving signal, thereby increasing the number of turn-on times of the sensing transistor M2, thus improving the number of times the sensing transistor M2 senses the electrical signal at the second electrode S of the driving transistor M3, thereby improving the sensing accuracy.

In the embodiments of the present disclosure, by adding the second output circuit and the corresponding second clock signal, the frequency of the first output signal can be increased, so that the number of times of sensing by the sensing transistor M3 can be increased, and the sensing accuracy can be improved.

For example, in some examples, the second output circuit 132 is further configured to, in a second phase (the display period shown in FIG. 1B) different from the first phase, under control of the level of the first node, output a pulse signal or an invalid signal at the first output terminal SOUT as the first output signal when the shift output terminal outputs the first level of the shift signal. For example, in the introduction of FIG. 1B, in the second phase, the sensing transistor M2 is not used for sensing, in the phase, the sensing transistor M2 can be turned off or turned on, it is not necessary to increase the frequency of the sensing driving signal. Therefore, in the second phase, an invalid signal (e.g., a low-level signal) for turning off the sensing transistor M2 or a pulse signal (for example, the high-level signal output in the output phase t3 as shown in FIG. 4C) for turning on the sensing transistor M2 may be output at the first output terminal SOUT.

For example, a pulse width of the pulse signal is the same as a width of the first level of the shift signal. For example, in the second phase, the shift output terminal COUT and the first output terminal SOUT output the same output signal, of course, may also output different signals, respectively, the embodiments of the present disclosure are not limited thereto.

Figure 4A:
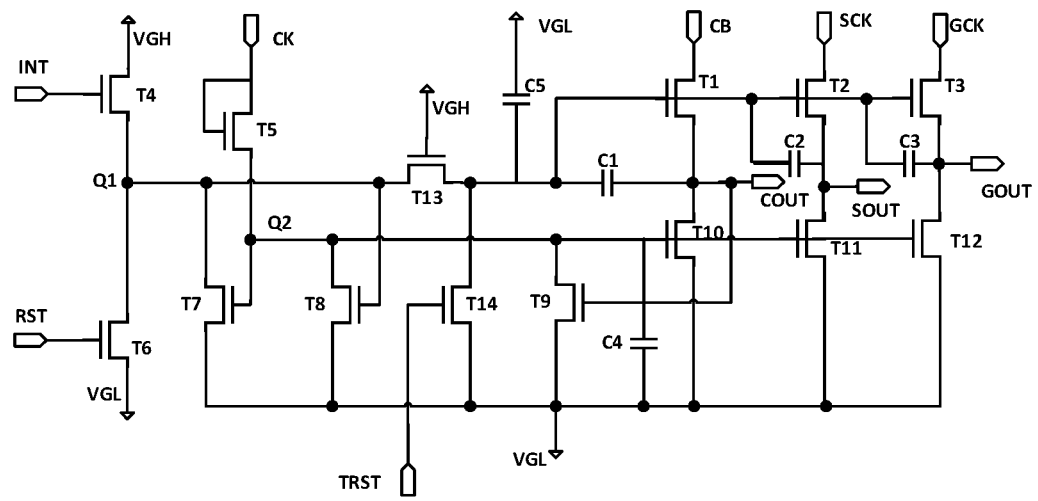
FIG. 4A is a circuit structure diagram of a specific implementation example of a shift register unit provided by at least one embodiment of the present disclosure.
Figure 4B:
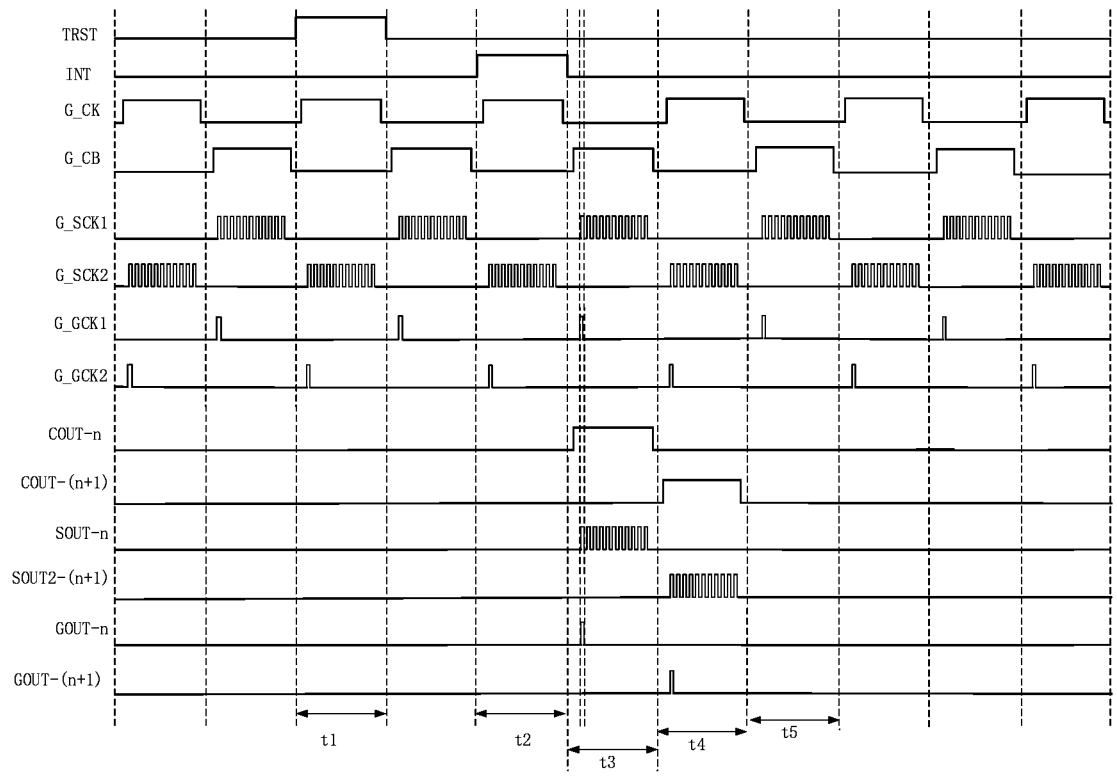
FIG. 4B is a working timing diagram of the shift register unit shown in FIG. 4A in a first phase (sensing phase)
Figure 4C:
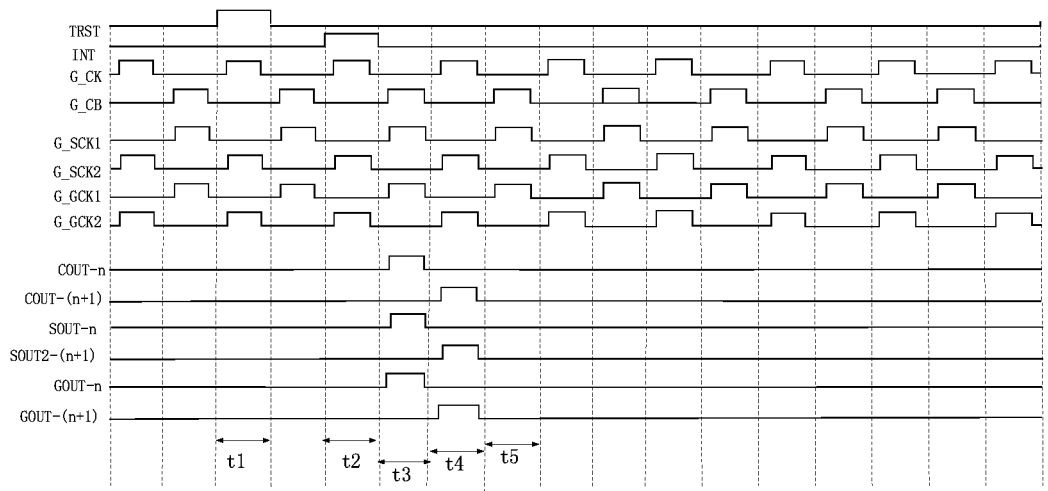
FIG. 4C is a working timing diagram of the shift register unit shown in FIG. 4A in a second phase.

For example, in the embodiments of the present disclosure, the pulse width and frequency of the first output signal in the first phase (the pulse width and frequency of the signal SOUT-n in the output phase t3 in FIG. 4B) are different from the pulse width and frequency (the pulse width and frequency of the signal SOUT-n in output phase t3 in FIG. 4C) of the first output signal in the second phase, so that the shift register unit of the embodiments of the present disclosure can output signals with different pulse widths and frequencies.

Figure 3:
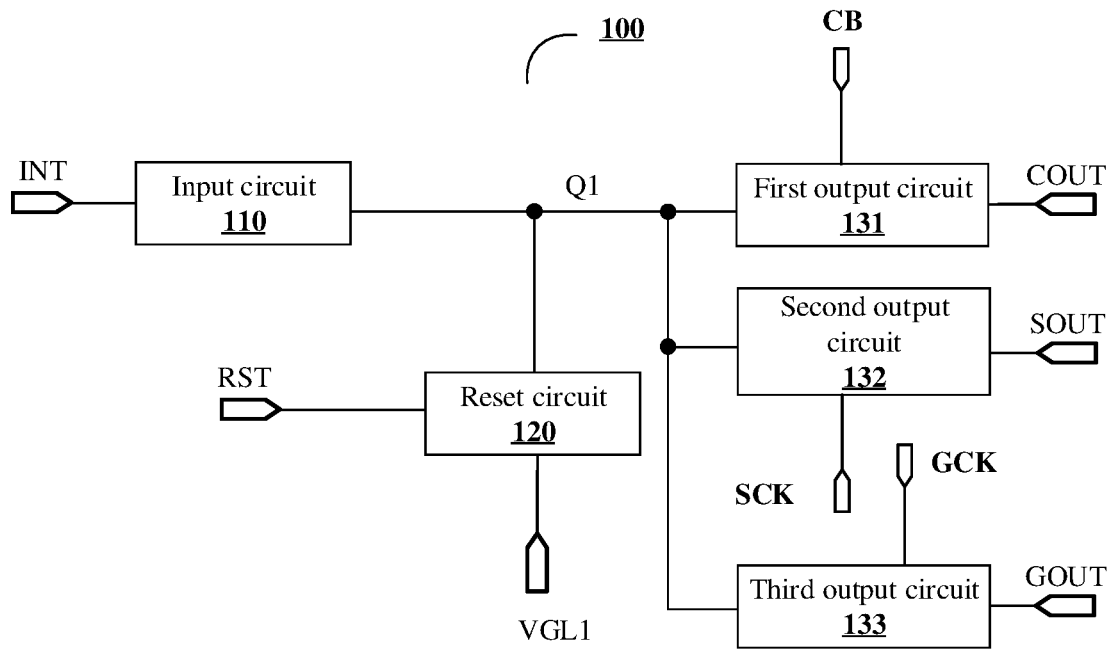
FIG. 3 is a schematic diagram of another shift register unit provided by at least one embodiment of the present disclosure.

FIG. 3 is a schematic diagram of another shift register unit provided by at least one embodiment of the present disclosure. For example, as shown in FIG. 3, based on the example shown in FIG. 2, the shift register unit 100 further includes a third output circuit 133.

For example, the third output circuit 133 is coupled to the first node Q1 and at least one second output terminal GOUT, and is configured to, under control of the level of the first node Q1, output a second output signal at the second output terminal GOUT when the first output terminal SOUT outputs a first sub-pulse of the plurality of sub-pulses (as shown in FIG. 4B). For example, in some examples, the third output circuit 133 is coupled to a third clock signal terminal GCK, the first node Q1, and the second output terminal GOUT (only one second output terminal GOUT is shown in FIG. 3), and is configured to be turned on under the control of the level of the first node Q1, transmit a third clock signal provided by the third clock signal terminal GCK to the second output terminal GOUT, and output the third clock signal as a scan driving signal at the second output terminal GOUT.

In the embodiments of the present disclosure, by adding a plurality of groups of output circuits and corresponding clock signals, waveforms with different pulse widths and frequencies can be output simultaneously, and the shift register unit can simultaneously output the sensing driving signal and the scan driving signal, thereby contributing to the implementation of signal synchronization and narrow frame.

For example, the shift output terminal COUT is used to provide an input signal for a next stage of shift register unit 100 (which will be described below) and to provide a reset signal for a previous stage of shift register unit, the first output terminal SOUT is used to provide a sensing driving signal for a row of pixel units in the display panel; the second output terminal GOUT is used for providing a scan driving signal for a row of pixel units in the display panel. For example, the shift output terminal COUT and the second output terminal GOUT output the same output signal. It should be noted that in other examples, when a plurality of scan signal output terminals are included, the plurality of scan signal output terminals may also output different output signals, respectively, the specific setting depends on the actual situation, and the embodiments of the present disclosure are not limited thereto.

For example, in a first phase, the second output signal is used to control the scan transistor M1 shown in FIG. 1A to be turned on to write the data signal into the gate electrode G3 of the driving transistor M3, so that the pulse width of the second output signal may only be the same as the pulse width of a single sub-pulse of the first output signal (as shown in FIG. 4B), as long as it can be ensured that the scan transistor M1 is turned on to enable the writing of the data signal. Of course, in the first phase, the pulse width of the second output signal can also be the same as the width of the shift signal, that is, the shift output terminal COUT and the second output terminal GOUT output the same output signal, as long as the output of the second output signal can be satisfied so that the scan transistor M1 can be turned on, the embodiments of the present disclosure are not limited to this case.

For example, the third output circuit 133 is further configured to, in the second phase, under control of the level of the first node Q1, output a pulse signal at the second output terminal GOUT as the second output signal when the shift output terminal COUT outputs the first level (for example, a high level) of the shift signal. That is, in the second phase, the shift output terminal COUT and the second output terminal GOUT output the same output signal, but the embodiments of the present disclosure are not limited to this case.

For example, in the embodiment of the present disclosure, the pulse width of the second output signal in the first phase (the pulse width of the signal GOUT-n in the output phase t3 in FIG. 4B) and the pulse width of the second output signal in the second phase (the pulse width of the signal GOUT-n in FIG. 4C) are different, so that signals with different pulse widths can be output by the shift register unit of the embodiment of the present disclosure.

It should be noted that FIG. 2 and FIG. 3 only show that the shift register unit includes an input circuit, a reset circuit, and an output circuit, but the embodiments of the present disclosure are not limited to this case, the shift register unit may further include a first node control circuit for controlling the level of the first node, an output control circuit for controlling the level of the output terminal, and the like. For details, reference may be made to designs in the art, and details are not repeated here.

Figure 5A:
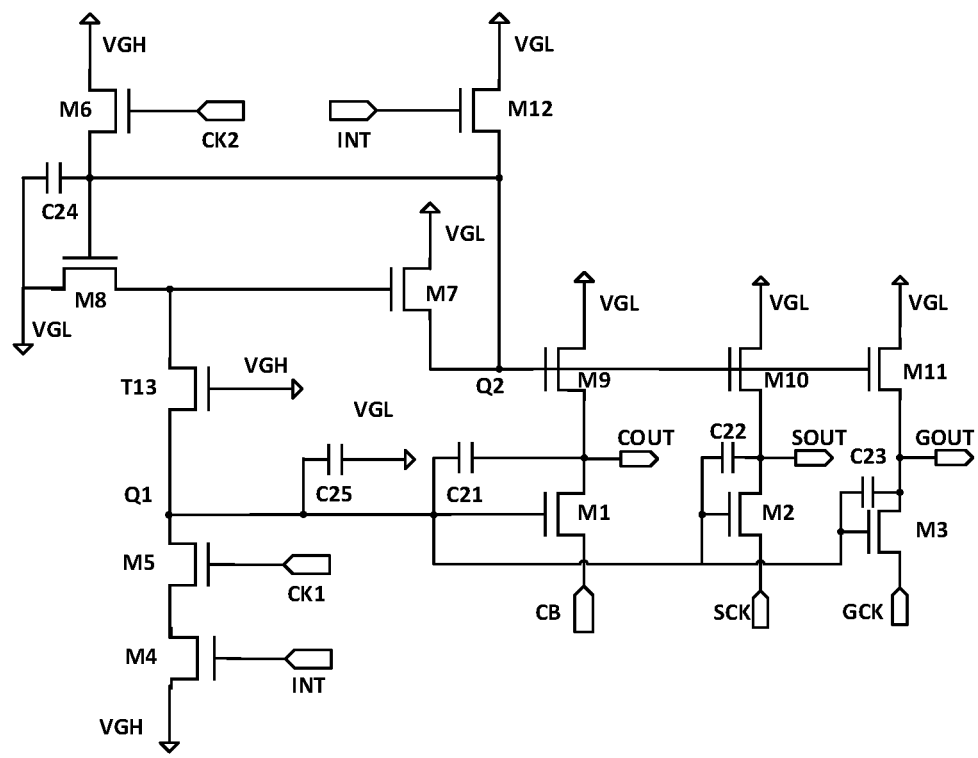
FIG. 5A is a circuit structure diagram of another specific implementation example of a shift register unit provided by at least one embodiment of the present disclosure.

FIG. 4A is a circuit structure diagram of a specific implementation example of a shift register unit provided by at least one embodiment of the present disclosure; and FIG. 5A is a circuit structure diagram of another specific implementation example of a shift register unit provided by at least one embodiment of the present disclosure. For example, as shown in FIG. 4A, the shift register unit 100 includes first to fourteenth transistors T1-T14, and further includes first to fifth capacitors C1 to C5. For example, as shown in FIG. 5A, the shift register unit 100 includes first to thirteenth transistors M1-M13, and further includes first to fifth capacitors C21 to C25. It should be noted that, in the following description, each transistor is an N-type transistor as an example for illustration, but this case does not constitute a limitation to the embodiments of the present disclosure.

For example, as shown in FIGS. 4A and 5A, in some examples, in the case of including one shift output terminal COUT, the first output circuit 131 may be implemented as a first transistor T1 and a first capacitor C1 or a first transistor M1 and a first capacitor C21. The following takes the coupling relationship between the first transistor T1 and the first capacitor C1 as an example for introduction, the coupling relationship between the first transistor M1 and the first capacitor C21 is similar to the coupling relationship between the first transistor T1 and the first capacitor C1, and similar portions are not repeated. For example, a gate electrode of the first transistor T1 is coupled to the first node Q1, a first electrode of the first transistor T1 is coupled to the first clock signal terminal CB to receive the first clock signal, a second electrode of the first transistor T1 is coupled to the shift output terminal; a first electrode of the first capacitor C1 is coupled to the first node Q1, and a second electrode of the first capacitor C1 is coupled to the shift output terminal COUT.

For example, as shown in FIGS. 4A and 5A, in some examples, in the case of including one first output terminal SOUT, the second output circuit 132 may be implemented as a second transistor T2 and a second capacitor C2 or a second transistor M2 and a second capacitor C22. The following takes the coupling relationship between the second transistor T2 and the second capacitor C2 as an example for introduction, the coupling relationship between the second transistor M2 and the second capacitor C22 is similar to the coupling relationship between the second transistor T2 and the second capacitor C2, and similar portions are not repeated. For example, a gate electrode of the second transistor T2 is coupled to the first node Q1, a first electrode of the second transistor T2 is coupled to the second clock signal terminal SCK to receive the second clock signal, and a second electrode of the second transistor T2 is coupled to the first output terminal SOUT; a first electrode of the second capacitor C2 is coupled to the first node Q1, and a second electrode of the second capacitor C2 is coupled to the first output terminal SOUT.

Because the second output circuit 132 is coupled to the second clock signal terminal SCK, the outputted second clock signal is used as the first output signal. Therefore, each cycle of the second clock signal includes a first period (for example, the output phase t3 of the first output signal SOUT as shown in FIG. 4B) corresponding to a first level (e.g., an valid level phase, e.g., a high level phase) of the shift signal and a second period (e.g., a low level phase) corresponding to a second level (e.g., an invalid level phase, e.g., a low level phase) of the shift signal; in the first phase, the first period includes a plurality of sub-pulses, so that the second output circuit 132 can output a first output signal having a plurality of sub-pulses at the first output terminal SOUT; in the second phase, the first period includes a pulse signal or an invalid signal; the level of the second period remains unchanged (e.g., remains low).

For example, in some examples, in the case of including one second output terminal GOUT, the third output circuit 133 may be implemented as a third transistor T3 and a third capacitor C3 or a third transistor M3 and a third capacitor C23. The following takes the coupling relationship between the third transistor T3 and the third capacitor C3 as an example for introduction, the coupling relationship between the third transistor M3 and the third capacitor C23 is similar to the coupling relationship between the third transistor T3 and the third capacitor C3, and similar portions are not repeated. For example, a gate electrode of the third transistor T3 is coupled to the first node Q1, a first electrode of the third transistor T3 is coupled to the third clock signal terminal GCK to receive the third clock signal, and a second electrode of the third transistor T3 is coupled to the second output terminal GOUT; a first electrode of the third capacitor C3 is coupled to the first node Q1, and a second electrode of the third capacitor C3 is coupled to the second output terminal GOUT.

Because the third output circuit 133 is coupled to the third clock signal terminal GCK, the output third clock signal is used as the second output signal. Therefore, for example, in the first phase, the pulse width of each cycle of the third clock signal is the same as the width of a single sub-pulse in the plurality of sub-pulses; in the second phase, the pulse width of each cycle of the third clock signal is the same as the pulse width of the shift signal, that is, in the second phase, the shift output terminal COUT and the second output terminal GOUT output the same output signal, but the embodiments of the present disclosure are not limited to this case.

For example, in different first phases (e.g., a first phase corresponding to pixel units in an n-th row and a first phase corresponding to pixel units in a m-th row), the number of sub-pulses, included in the first period, of the second clock signal of the shift register unit coupled to the pixel units in the n-th row is different from the number of sub-pulses, included in the first period, of the second clock signal of the shift register unit coupled to the pixel units in the m-th row, so that the number of the plurality of sub-pulses output in an n-th first phase is different from the number of the plurality of sub-pulses output in a m-th first phase; of course, the number of sub-pulses, included in the first period, of the second clock signal of the shift register unit coupled to the pixel units in the n-th row may also be the same as the number of sub-pulses, included in the first period, of the second clock signal of the shift register unit coupled to the pixel units in the m-th row, and therefore, the number of the plurality of sub-pulses output in the n-th first phase is the same as the number of the plurality of sub-pulses output in the m-th first phase, the specific situation can be determined according to the actual situation, and the embodiments of the present disclosure do not limit this.

As shown in FIG. 4A, the input circuit 110 of the shift register unit 100 may be implemented as a fourth transistor T4 and a fifth transistor T5.

For example, a gate electrode of the fourth transistor T4 is coupled to the input terminal INT to receive the input signal, a first electrode of the fourth transistor T4 is coupled to the first voltage terminal VGH to receive the first voltage, and a second electrode of the fourth transistor T4 is coupled to the first node Q1.

For example, a gate electrode and a first electrode of the fifth transistor T5 are coupled to each other, and both are coupled to the fourth clock signal terminal CK to receive the fourth clock signal, and a second electrode of the fifth transistor T5 is coupled to the second node Q2.

For example, the reset circuit 120 may be implemented as a sixth transistor T6. For example, a gate electrode of the sixth transistor T6 is coupled to the reset terminal RST, a first electrode of the sixth transistor T6 is coupled to the first node Q1, and a second electrode of the sixth transistor T6 is coupled to the second voltage terminal VGL to receive second voltage.

For example, the shift register unit 100 further includes a seventh transistor T7 to a fourteenth transistor T14 and a fourth capacitor C4-a fifth capacitor C5 for implementing other functions of the shift register unit. For specific implementation functions, reference may be made to the introduction in the filed, and details will not be repeated here.

For example, a gate electrode of the seventh transistor T7 is coupled to the second node Q2, a first electrode of the seventh transistor T7 is coupled to the first node Q1, and a second electrode of the seventh transistor T7 is coupled to the second voltage terminal VGL to receive the second voltage.

For example, a gate electrode of the eighth transistor T8 is coupled to the first node Q1, a first electrode of the eighth transistor T8 is coupled to the second node Q2, and a second electrode of the eighth transistor T8 is coupled to the second voltage terminal VGL to receive the second voltage.

For example, a gate electrode of the ninth transistor T9 is coupled to the shift output terminal COUT, a first electrode of the ninth transistor T9 is coupled to the second node Q2, and a second electrode of the ninth transistor T9 is coupled to the second voltage terminal VGL to receive the second voltage.

For example, a gate electrode of the tenth transistor T10 is coupled to the second node Q2, a first electrode of the tenth transistor T10 is coupled to the shift output terminal COUT, and a second electrode of the tenth transistor T10 is coupled to the second voltage terminal VGL to receive the second voltage.

For example, a gate electrode of the eleventh transistor T11 is coupled to the second node Q2, a first electrode of the eleventh transistor T11 is coupled to the first output terminal S OUT, and a second electrode of the eleventh transistor T11 is coupled to the second voltage terminal VGL to receive the second voltage.

For example, a gate electrode of the twelfth transistor T12 is coupled to the second node Q2, a first electrode of the twelfth transistor T12 is coupled to the second output terminal GOUT, and a second electrode of the twelfth transistor T12 is coupled to the second voltage terminal VGL to receive the second voltage.

For example, a gate electrode of the thirteenth transistor T13 is coupled to the first voltage terminal VGH to receive the first voltage, a first electrode of the thirteenth transistor T13 is coupled to the first node Q1, and a second electrode of the thirteenth transistor T13 is coupled to the first electrode of the first capacitor C1.

For example, a gate electrode of the fourteenth transistor T14 is coupled to a total reset terminal TRST to receive a total reset signal, a first electrode of the fourteenth transistor T14 is coupled to the first electrode of the first capacitor C1, and a second electrode of the fourteenth transistor T14 is coupled to the second voltage terminal VGL to receive the second voltage.

For example, a first electrode of the fourth capacitor C4 is coupled to the second node Q2, and a second electrode of the fourth capacitor C4 is coupled to the second voltage terminal VGL to receive the second voltage.

For example, a first electrode of the fifth capacitor C5 is coupled to the first node Q1, and a second electrode of the fifth capacitor C5 is coupled to the second voltage terminal VGL to receive the second voltage.

FIG. 4B is a working timing diagram of the shift register unit shown in FIG. 4A in a first phase (sensing phase). The first clock signal terminal CB of an n-th stage of shift register unit is coupled to the signal line GCB, and the first clock signal terminal CB of a (n+1)-th stage of shift register unit is coupled to the signal line GCK; the second clock signal terminal SCK of the n-th stage of shift register unit is coupled to the signal line SCK1, and the second clock signal terminal SCK of the (n+1)-th stage of shift register unit is coupled to the signal line SCK2; the third clock signal terminal GCK of the n-th stage of shift register unit is coupled to the signal line GCK1, and the third clock signal terminal GCK of the (n+1)-th stage of shift register unit is coupled to the signal line GCK2. It should be noted that the level of the potential in the signal timing diagram shown in FIG. 4B is only schematic and does not represent the actual potential value or the relative ratio. Corresponding to the above example, the high-level signal corresponds to the turn-on signal of the N-type transistor, and the low-level signal corresponds to the turn-off signal of the N-type transistor.

The working process of the n-th (n is an integer greater than or equal to 1) stage of shift register unit is used as an example for description below. For example, as shown in FIG. 4B, the first phase of the shift register unit 100 includes a full reset phase t1, an input phase t2, an output phase t3, a pull-down phase t4, and a low-level hold phase t5.

In the full reset stage t1, that is, before the shift register unit 100 works, the total reset terminal receives a high level, so that the fourteenth transistor T14 is turned on, so that the level of the first node Q1 is pulled down, and therefore, the gate electrodes of the first transistor T1 to the third transistor T3 become a low level, thus the first transistor T1 to the third transistor T3 are turned off, thereby achieving the resetting of all shift register units 100 of the gate driving circuit.

In the input phase t2, the first clock signal terminal CB receives a low level provided by the clock signal line G_CB, the second clock signal terminal SCK receives a low level provided by the clock signal line G_SCK1, the third clock signal terminal GCK receives a low level provided by the clock signal line G_GCK1, the fourth clock signal terminal CK receives a high level provided by the clock signal line G_CK, and the input terminal INT receives a high level, the fourth transistor T4 is turned on, so that the first node Q1 is pulled up to a high level, the thirteenth transistor T13 is turned on, the gate electrodes of the first transistor T1 to the third transistor T3 are set to a high level, so that the first transistor T1 to the third transistor T3 are turned on, and therefore, the shift output terminal COUT-n outputs the low level received by the first clock signal terminal CB, the first output terminal SOUT-n outputs the low level received by the second clock signal terminal SCK, and the second output terminal GOUT-n outputs the low level received by the third clock signal terminal GCK; at the same time, the eighth transistor T8 is turned on, the second node Q2 is pulled down to a low level, the gate electrodes of the tenth transistor T10 to the twelfth transistor T12 are pulled down to a low level, so that the tenth transistor T10 to the twelfth transistor T12 are turned off, and because the fourth clock signal terminal CK receives a high level, the fifth transistor T5 is turned on, so that the gate voltage of the seventh transistor T7 is VGH-Vth, and thus the seventh transistor T7 is turned off.

In the output phase t3, the input terminal INT receives a low level, the fourth clock signal terminal CK receives a low level provided by the clock signal line G_CK, the first clock signal terminal CB receives a high level provided by the clock signal line G_CB, the second clock signal terminal SCK receives the signal with a plurality of sub-pulses provided by the clock signal line G_SCK1, and the third clock signal terminal GCK receives the high-level signal provided by the clock signal line G_GCK1 (for example, as shown in FIG. 4B, the pulse width of the high-level signal is the same as the pulse width of a single sub-pulse among the plurality of sub-pulses received by the second clock signal terminal SCK), the fourth transistor T4 is turned off, the fifth transistor T5 is turned off, and the fifth capacitor C5 maintains the high level of the gate electrodes of the first transistor T1 to the third transistor T3, so that the first transistor T1 to the third transistor T3 are turned on, and therefore, the high level received by the first clock signal terminal CB is output at the shift output terminal COUT-n, and the plurality of sub-pulses received by the second clock signal terminal SCK are output at the first output terminal SOUT-n as the first output signal, and the high-level signal received by the third clock signal terminal GCK is output at the second output terminal GOUT-n as the second output signal. Because the first output signal has a plurality of sub-pulses, the frequency of the first output signal can be increased, thereby increasing the number of times of sensing by the sensing transistor M3 and improving the sensing accuracy.

At the same time, in this phase, due to the bootstrapping effect of the first capacitor C1 to the third capacitor C3, the levels of the gate electrodes of the first transistor T1 to the third transistor T3 are increased, so as to ensure that the first transistor T1 to the third transistor T3 can completely output the high level received by the first clock signal terminal CB, the high level received by the second clock signal terminal SCK, and the high level received by the third clock signal terminal GCK, at the same time, the ninth transistor T9 is turned on, so that the gate potentials of the tenth transistor 10 to the twelfth transistor T12 are pulled down to a low level, and thus, the tenth transistor 10 to the twelfth transistor T12 are turned off.

In the pull-down phase t4, the first clock signal terminal CB receives the low level provided by the clock signal line G_CB, the second clock signal terminal SCK receives the low level provided by the clock signal line G_SCK1, and the third clock signal terminal GCK receives the low level provided by the clock signal line G_GCK1, due to the voltage holding effect of the first capacitor C1 to the third capacitor C3, the first transistor T1 to the third transistor T3 are always turned on. Therefore, in this phase, the first transistor T1 to the third transistor T3 output low levels, the ninth transistor T9 is turned off, and due to the bootstrapping effect of the first capacitor C1 to the third capacitor C3, the levels of the gate electrodes of the first transistor T1 to the third transistor T3 are gradually pulled down.

In the low-level hold phase t5, the fourth clock signal terminal CK receives the high level provided by the clock signal line G_CK, the fifth transistor T5 is turned on, so that the gate electrode of the seventh transistor T7 (i.e., the second node Q2) is at a high level, so that the seventh transistor T7 is turned on to pull down the level of the first node Q1, therefore, the levels of the gate electrodes of the first transistor T1 to the third transistor T3 become low; at the same time, the reset terminal RST (for example, the reset terminal RST is coupled to the output terminal COUT_(n+2) of an (n+2)-th stage of shift register unit which is separated from the n-th stage of shift register unit by one stage) receives a high-level reset signal, so that the sixth transistor T6 is turned on, the gate electrodes of the first transistor T1 to the third transistor T3 are pulled down, the first transistor T1 to the third transistor T3 are turned off, the high level of the second node Q2 makes the tenth transistor T10 to the twelfth transistor T12 be turned on, so that the shift output terminal COUT, the first output terminal SOUT, and the second output terminal GOUT output low levels, and the fourth capacitor C4 is used to maintain the low potential of the second node Q2 to avoid false output.

FIG. 4C is a working timing diagram of the shift register unit shown in FIG. 4A in a second phase (for example, a display phase). As shown in FIG. 4C, in the second phase, the working process of the shift register unit 100 is similar to the working process shown in FIG. 4B, the only difference is that: in the output phase t3, the second clock signal terminal SCK receives the high-level signal provided by the clock signal line G_SCK1, for example, the pulse width of the high-level signal and the pulse width of the first clock signal provided by the signal line G_CB received by the first clock signal terminal CB are the same, and of course, may also be different, which is not limited by the embodiments of the present disclosure; the third clock signal terminal GCK receives the high-level signal provided by the clock signal line G_GCK1. For example, the pulse width of the high-level signal and the pulse width of the high-level signal received by the second clock signal terminal SCK are the same, and of course, can also be different, which is not limited by the embodiments of the present disclosure.

It should be noted that, in the output phase t3 of the second phase, the clock signal line G_SCK1 can also provide an invalid signal to the second clock signal terminal SCK, that is, when the shift output terminal COUT of the first output circuit 131 outputs the first level (e.g., a low level) of the shift signal, the second output circuit 132 may also output an invalid signal at the first output terminal SOUT as the first output signal, as long as the normal driving of the pixel unit 40 by the shift register unit 100 is not affected, the embodiments of the present disclosure are not limited to this case.

For example, in the example shown in FIG. 5A, the input circuit 110 may be implemented as a fourth transistor M4 and a fifth transistor M5.

For example, a gate electrode of the fourth transistor M4 is coupled to the input terminal INT to receive the input signal, a first electrode of the fourth transistor M4 is coupled to the first voltage terminal VGH to receive the first voltage, a second electrode of the fourth transistor M4 is coupled to a first electrode of the fifth transistor M5, a gate electrode of the fifth transistor M5 is coupled to the fourth clock signal terminal CK1 to receive the fourth clock signal, and a second electrode of the fifth transistor M5 is coupled to the first node Q1.

For example, the reset circuit 120 may be implemented as the sixth transistor M6. For example, a gate electrode of the sixth transistor M6 is coupled to a fifth clock signal terminal CK2 (e.g., as a reset terminal) to receive a fifth clock signal as the reset signal, a first electrode of the sixth transistor M6 is coupled to the first voltage terminal VGH to receive the first voltage, and a second electrode of the sixth transistor M6 is coupled to the second node Q2.

For example, in the example shown in FIG. 5A, the shift register unit 100 further includes a seventh transistor M7 to a thirteenth transistor M13 and a fourth capacitor C4 to a fifth capacitor C5 for implementing other functions of the shift register unit. For specific implementation functions, reference may be made to the introduction in the filed, and details will not be repeated here.

For example, a gate electrode of the seventh transistor M7 is coupled to a first electrode of the eighth transistor M8, a first electrode of the seventh transistor M7 is coupled to the second voltage terminal VGL to receive the second voltage, and a second electrode of the seventh transistor M7 is coupled to the second node Q2.

For example, a gate electrode of the eighth transistor M8 is coupled to the second node Q2, and a second electrode of the eighth transistor M8 is coupled to the second voltage terminal VGL to receive the second voltage.

For example, a gate electrode of the ninth transistor M9 is coupled to the second node Q2, a first electrode of the ninth transistor M9 is coupled to the second voltage terminal VGL to receive the second voltage, and a second electrode of the ninth transistor M9 is coupled to the shift output terminal COUT.

For example, a gate electrode of the tenth transistor M10 is coupled to the second node Q2, a first electrode of the tenth transistor M10 is coupled to the second voltage terminal VGL to receive the second voltage, and a second electrode of the tenth transistor M10 is coupled to the first output terminal SOUT.

For example, a gate electrode of the eleventh transistor M11 is coupled to the second node Q2, a first electrode of the eleventh transistor M11 is coupled to the second voltage terminal VGL to receive the second voltage, and a second electrode of the eleventh transistor M11 is coupled to the second output terminal GOUT.

For example, a gate electrode of the twelfth transistor M12 is coupled to the input terminal INT to receive the input signal, a first electrode of the twelfth transistor M12 is coupled to the second voltage terminal VGL to receive the second voltage, and a second electrode of the twelfth transistor M12 is coupled to the second node Q2.

For example, a gate electrode of the thirteenth transistor M13 is coupled to the first voltage terminal VGH to receive the first voltage, a first electrode of the thirteenth transistor M13 is coupled to the first electrode of the eighth transistor M8, and a second electrode of the thirteenth transistor M13 is coupled to the first node Q1.

For example, a first electrode of the fourth capacitor C4 is coupled to the second node Q2, and a second electrode of the fourth capacitor C4 is coupled to the second voltage terminal VGL.

For example, a first electrode of the fifth capacitor C5 is coupled to the first node Q1, and a second electrode of the fifth capacitor C5 is coupled to the second voltage terminal VGL.

It should be noted that the specific implementation of the shift register unit 100 is not limited to the circuit structures shown in FIG. 4A and FIG. 5A, and may also be other circuit structures in the art, the embodiments of the present disclosure do not limit this.

Figure 5B:
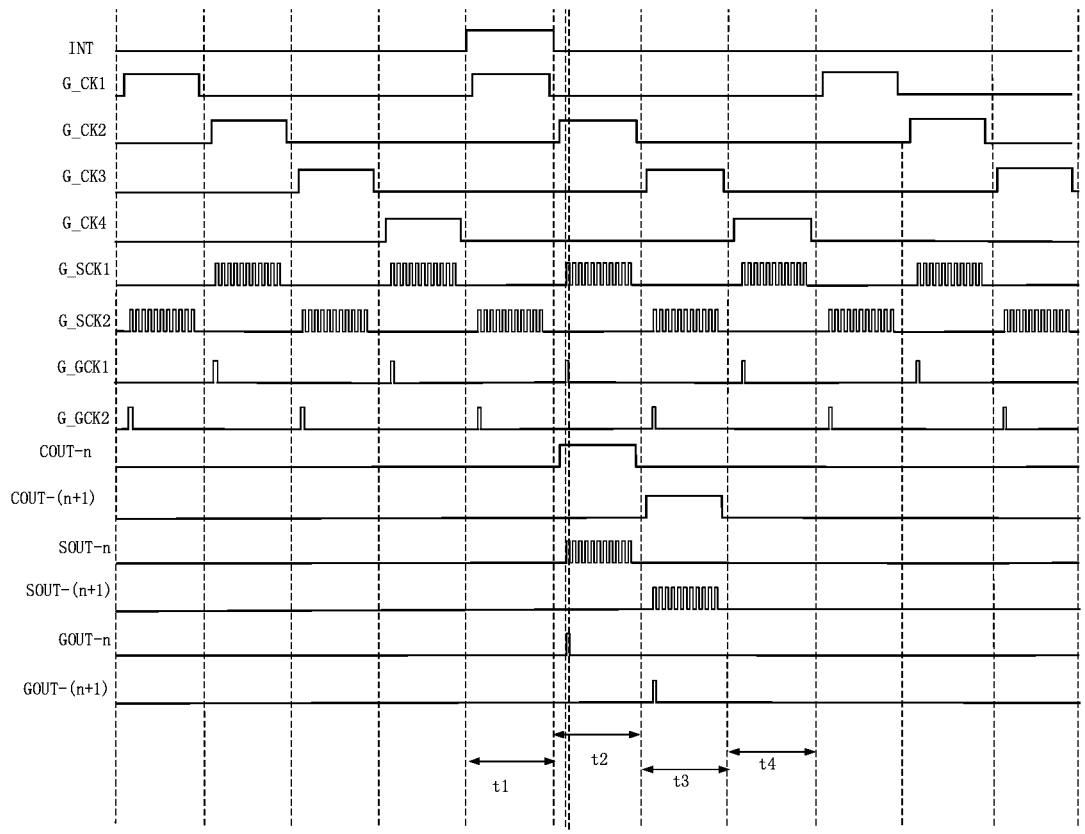
FIG. 5B is a working timing diagram of the shift register unit shown in FIG. 5A in a first phase (sensing phase)

FIG. 5B is a working timing diagram of the shift register unit shown in FIG. 5A in a first phase (sensing phase). Next, the operation process of the n-th (n is an integer greater than or equal to 1) stage of shift register unit is taken as an example for description. Regarding the coupling relationship of the clock signal lines, for example, the fourth clock signal terminal CK1, the first clock signal terminal CB, and the fifth clock signal terminal CK2 of the n-th stage of shift register unit are respectively coupled to the signal lines G_CK1, G_CK2, and G_CK3; the fourth clock signal terminal CK1, the first clock signal terminal CB, and the fifth clock signal terminal CK2 of the (n+1)-th stage of shift register unit are respectively coupled to the signal lines GCK2, G_CK3, and G_CK4; the fourth clock signal terminal CK1, the first clock signal terminal CB, and the fifth clock signal terminal CK2 of the (n+2)-th stage of shift register unit are respectively coupled to the signal lines G_CK3, G_CK4, and G_CK1, and so on; the second clock signal terminal SCK of the n-th stage of shift register unit is coupled to the signal line G_SCK1, and the second clock signal terminal SCK of the (n+1)-th stage of shift register unit is coupled to the signal line G_SCK2; the third clock signal terminal GCK of the n-th stage of shift register unit is coupled to the signal line G_GCK1, and the third clock signal terminal GCK of the (n+1)-th stage of shift register unit is coupled to the signal line G_GCK2.

It should be noted that the levels of the potentials in the signal timing diagram shown in FIG. 5B are only schematic, and do not represent the actual potential values or relative ratios, corresponding to the above example, the high-level signal corresponds to the turn-on signal of the N-type transistor, and the low-level signal corresponds to the turn-off signal of the N-type transistor. In the following, the corresponding description is given by taking the working process of the n-th stage of shift register unit as an example.

For example, as shown in FIG. 5B, the first phase of the shift register unit 100 includes an input phase t1, an output phase t2, a pull-down phase t3, and a low-level hold phase t4.

In the input phase t1, the input terminal INT inputs a high level, the fourth clock signal terminal CK1 receives the high level of the clock signal line G_CK1, the fourth transistor M4 and the fifth transistor M5 are turned on, so that the level of the first node Q1 is pulled up to a high level, the first transistor M1 to the third transistor M3 are turned on, the shift output terminal COUT outputs the low level provided by the clock signal line G_CK2 received by the first clock signal terminal CB, the first output terminal SOUT outputs the low level provided by the signal line G_SCK1, and the second output terminal GOUT outputs the low level provided by the signal line G_GCK1; at the same time, the twelfth transistor M12 is turned on, and the second node Q2 is pulled down to a low level, so that the ninth transistor M9 to the eleventh transistor M11 are turned off.

In the output phase t2, the first clock signal terminal CB receives the high level provided by the clock signal line G_CK2, and the second clock signal terminal SCK receives the signal with a plurality of sub-pulses provided by the clock signal line G_SCK1, the third clock signal terminal GCK receives the high-level signal provided by the clock signal line G_GCK1 (for example, as shown in FIG. 5B, the pulse width of the high-level signal is the same as the pulse width of a single sub-pulse among the plurality of sub-pulses received by the second clock signal terminal SCK), because the fifth capacitor C5 maintains the high level of the gate electrodes (i.e., the first node Q1) of the first transistor M1 to the third transistor M3, the first transistor M1 to the third transistor M3 are turned on, and therefore, the high level received by the first clock signal terminal CB is output at the shift output terminal COUT-n, the plurality of sub-pulses received by the second clock signal terminal SCK are output at the first output terminal SOUT-n as the first output signal, and the high-level signal received by the third clock signal terminal GCK is output at the second output terminal GOUT-n as the second signal. Because the first output signal has a plurality of sub-pulses, the frequency of the first output signal can be increased, thereby increasing the number of times of sensing by the sensing transistor M3 and improving the sensing accuracy.

At the same time, in this phase, due to the bootstrapping effect of the first capacitor C1 to the third capacitor C3, the levels of the gate electrodes of the first transistor M1 to the third transistor M3 are increased, so as to ensure that the first transistor M1 to the third transistor M3 can completely output the high level received by the first clock signal terminal CB, the high level received by the second clock signal terminal SCK, and the high level received by the third clock signal terminal GCK.

In the pull-down phase t3, the first clock signal terminal CB receives the low level provided by the clock signal line G_CK2, the second clock signal terminal SCK receives the low level provided by the clock signal line G_SCK1, and the third clock signal terminal GCK receives the low level provided by the clock signal line G_GCK1, due to the voltage holding effect of the first capacitor C1 to the third capacitor C3, the first transistor M1 to the third transistor M3 are always turned on, and therefore, in this phase, the first transistor M1 to the third transistor M3 output a low level.

In the low-level hold phase t4, the fifth clock signal terminal CK2 (for example, as the reset terminal RST) receives the high level provided by the signal line G_CK3, the sixth transistor M6 is turned on, thereby pulling the level of the second node Q2 up to a high level, so that the eighth transistor M8 is turned on, thereby pulling down the level of the first node Q1, therefore, the levels of the gate electrodes of the first transistor M1 to the third transistor M3 become low; the high level of the second node Q2 makes the ninth transistor M9 to the eleventh transistor M11 be turned on, so that the shift output terminal COUT, the first output terminal SOUT, and the second output terminal GOUT output low levels, and the fourth capacitor C4 is used to maintain the low potential of the second node Q2 to avoid false output.

Figure 5C:
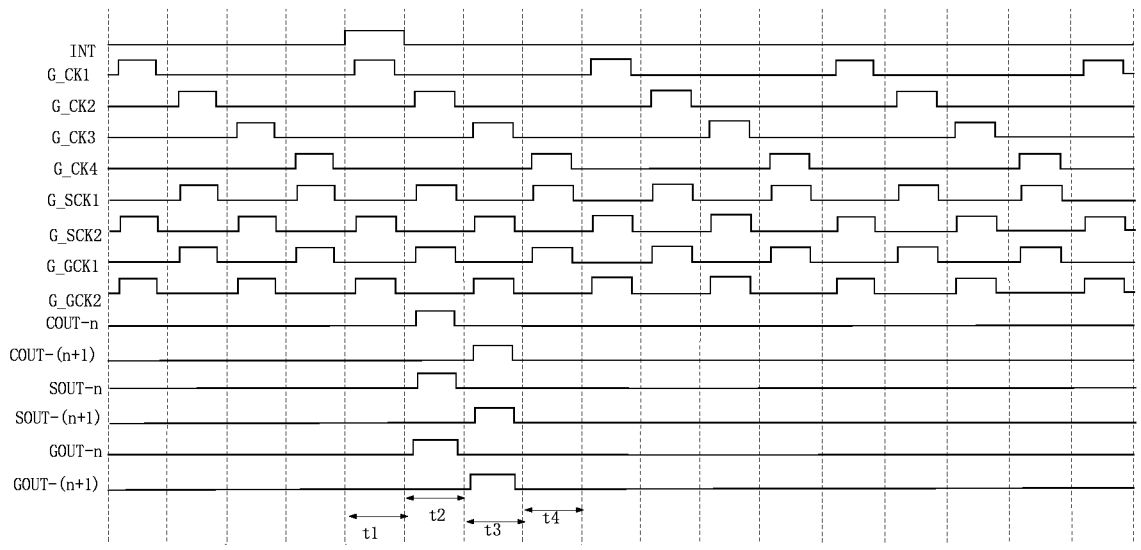
FIG. 5C is a working timing diagram of the shift register unit shown in FIG. 5A in a second phase.

FIG. 5C is a working timing diagram of the shift register unit shown in FIG. 5A in a second phase. As shown in FIG. 5C, in the second phase, the working process of the shift register unit 100 is similar to the working process shown in FIG. 5B, the only difference is that: in the output phase t2, the second clock signal terminal SCK receives the high-level signal provided by the clock signal line G_SCK1, for example, the pulse width of the high-level signal and the pulse width of the first clock signal provided by the signal line G_CK2 received by the first clock signal terminal CB are the same, and of course, may also be different, which is not limited by the embodiments of the present disclosure; the third clock signal terminal GCK receives the high-level signal provided by the clock signal line G_GCK1. For example, the pulse width of the high-level signal and the pulse width of the high-level signal received by the second clock signal terminal SCK are the same, and of course, can also be different, which is not limited by the embodiments of the present disclosure.

It should be noted that, in the output phase t2 of the second phase (e.g., the display phase), the clock signal line G_SCK1 can also provide an invalid signal to the second clock signal terminal SCK, that is, when the shift output terminal COUT of the first output circuit 131 outputs the first level of the shift signal, the second output circuit 132 may also output an invalid signal at the first output terminal SOUT as the first output signal, as long as the normal driving of the pixel unit 40 by the shift register unit 100 is not affected, the embodiments of the present disclosure do not limit this.

It should be noted that the figure only shows the case where the shift register unit 100 includes one first output circuit 131, one second output circuit 132, and one third output circuit 133, that is, the case where only one transistor and one capacitor are included, however, the embodiments of the present disclosure are not limited to this case. When the shift register unit 100 includes a plurality of first output circuits 131, a plurality of second output circuits 132, and a plurality of third output circuits 133, the number of transistors and the number of capacitors in FIG. 4A and FIG. 5A will also increase correspondingly, depending on the actual situation, and the embodiments of the present disclosure are not limited thereto.

For example, the first voltage terminal VGH is configured to provide a first voltage, for example, the first voltage is a DC high-level signal, and the second voltage terminal VGL is configured to provide a second voltage, for example, the second voltage is a DC low-level signal (e.g., lower than or equal to the low-level portion of the clock signal), such as grounding, for example, the first voltage is greater than the second voltage, the following embodiments are the same to those described herein, and similar portions will not be repeated.

Please note that the "valid level" of the shift register unit provided in the embodiments of the present disclosure refers to a level that enables the operated transistor included in the shift register unit to be turned on, correspondingly, the "invalid level" refers to a level that cannot enable the operated transistor included in the shift register unit to be turned on (i.e., the transistor is turned off). The valid level may be higher or lower than the invalid level depending on factors such as the type of transistor (N-type or P-type) in the circuit structure of the shift register unit. Generally, for the square wave pulse signal used by the shift register unit during operation, the valid level corresponds to the level of the square wave pulse portion of the square wave pulse signal, and the invalid level corresponds to the level of the non-square wave pulse portion.

It should be noted that, in the description of the various embodiments of the present disclosure, the first node Q1 and the second node Q2 do not represent actual components, but represent the junction of the relevant electrical coupling in the circuit diagram.

It should be noted that, transistors used in the embodiments of the present disclosure may be thin film transistors, field effect transistors, or other switching devices with the same characteristics, in the embodiments of the present disclosure, the thin film transistor is used as an example for description. A source electrode and a drain electrode of a transistor used here may be symmetrical in structure, so the source electrode and the drain electrode of the transistor may have no difference in physical structure. In the embodiments of the present disclosure, in order to distinguish two electrodes of the transistor in addition to a gate electrode, one of the two electrodes is directly referred to as a first electrode, and the other of the two electrodes is referred to as a second electrode.

In addition, the transistors in the embodiments of the present disclosure are all described by using N-type transistors as an example, in this case, the first electrode of the transistor is the drain electrode, and the second electrode is the source electrode. It should be noted that the present disclosure includes but is not limited to this aspect. For example, one or more transistors in the shift register unit 100 provided by the embodiments of the present disclosure may also adopt P-type transistors, in this case, the first electrode of the transistor is the source electrode, and the second electrode is the drain electrode, as long as respective electrodes of a selected type transistor are correspondingly connected in accordance with respective electrodes of a corresponding transistor in the embodiments of the present disclosure, and the corresponding voltage terminals provide corresponding high or low voltages. In a case where an N-type transistor is adopted, Indium Gallium Zinc Oxide (IGZO) can be used as the active layer of the thin film transistor, which may effectively reduce the size of the transistor and prevent leakage current compared with using low temperature poly silicon (LTPS) or amorphous silicon (such as hydrogenated amorphous silicon) as the active layer of the thin film transistor.

Figure 6:
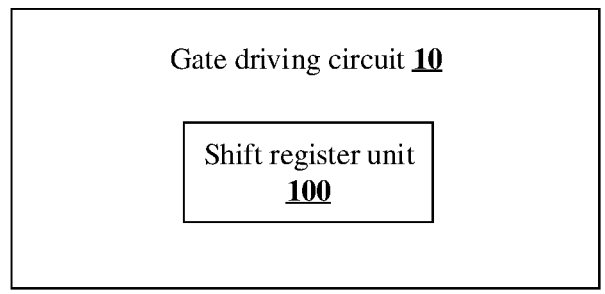
FIG. 6 is a schematic diagram of a gate driving circuit provided by at least one embodiment of the present disclosure.

At least one embodiment of the present disclosure further provides a gate driving circuit. FIG. 6 is a schematic diagram of a gate driving circuit provided by at least one embodiment of the present disclosure. For example, as shown in FIG. 6, the gate driving circuit 10 includes a plurality of cascaded shift register units 100, any one or more shift register units 100 may adopt the structure of the shift register unit 100 provided by any embodiment of the present disclosure or a modification thereof, for example, the shift register unit 100 shown in FIG. 4A or FIG. 5A may be adopted. For example, the gate driving circuit 10 can be directly integrated on the array substrate of the display device using the same semiconductor process as the thin film transistor, so as to implement the progressive or interlaced scanning driving function.

For example, except for a first stage of shift register unit, an input terminal INT of each of other stages of shift register units is coupled to a shift output terminal COUT of a previous stage of shift register unit of the other stages of shift register units; except for the last two stages of shift register units, a reset terminal RST of each of the other stages of shift register units is coupled to a shift output terminal COUT of a next stage of shift register unit which is separated from the other stages of shift register units by one stage. For example, the input terminal INT of the first stage of shift register unit may be configured to receive a trigger signal, which is not shown in FIG. 6 for the sake of brevity.

For example, the gate driving circuit 10 further includes a plurality of clock signal lines, for example, including the clock signal lines G_CK, G_CB, G_SCK1, G_SCK2, G_GCK1, G_GCK2, etc. shown in FIG. 4B, or including the clock signal lines G_CK1, G_CK2, G_CK3, G_CK4, G_SCK1, G_SCK2, G_GCK1, G_GCK2, etc. shown in FIG. 5B, to respectively provide clock signals to the clock signal terminals of the shift register units at all stages, for the specific coupling, reference may be made to the descriptions of FIG. 4B and FIG. 5B above, or to designs in the art, as long as the shift scanning of the gate driving circuit 10 can be implemented, the embodiments of the present disclosure are not limited to this case, and details are not described herein again. It should be noted that the gate driving circuit 10 may further include four, six, or eight, or more clock signal lines, and the number of clock signal lines depends on the specific situation and is not limited in the embodiment of the present disclosure.

For example, the gate driving circuit 10 may further include a timing controller (not shown in the figure). For example, the timing controller can be configured to be coupled to the above-mentioned clock signal lines, so as to provide clock signals to the clock signal terminals of the respective shift register units; the timing controller may also be configured to be coupled with a reset signal line and a reference voltage line (not shown in the figure), so as to provide the reset signal and the reference voltage to each shift register unit 100, respectively. For example, the timing controller may also be configured to provide a trigger signal. It should be noted that the phase relationship among the plurality of clock signals provided by the timing controller may be determined according to actual requirements.

It should be noted that when a display panel is driven by the gate driving circuit 10 provided by the embodiments of the present disclosure, the gate driving circuit 10 may be disposed on one side of the display panel. For example, the display panel includes a plurality of rows of gate lines, first output terminals in the gate driving circuit 10 may be configured to be coupled to the plurality of rows of gate lines in sequence for outputting sensing driving signals, and the second output terminals may be configured to be sequentially coupled to the plurality of rows of gate lines for outputting scan driving signals. It should be noted that, the gate driving circuit 10 may also be arranged on both sides of the display panel to achieve bilateral driving, and the embodiments of the present disclosure are not limited to the arrangement of the gate driving circuit 10.

Figure 7:
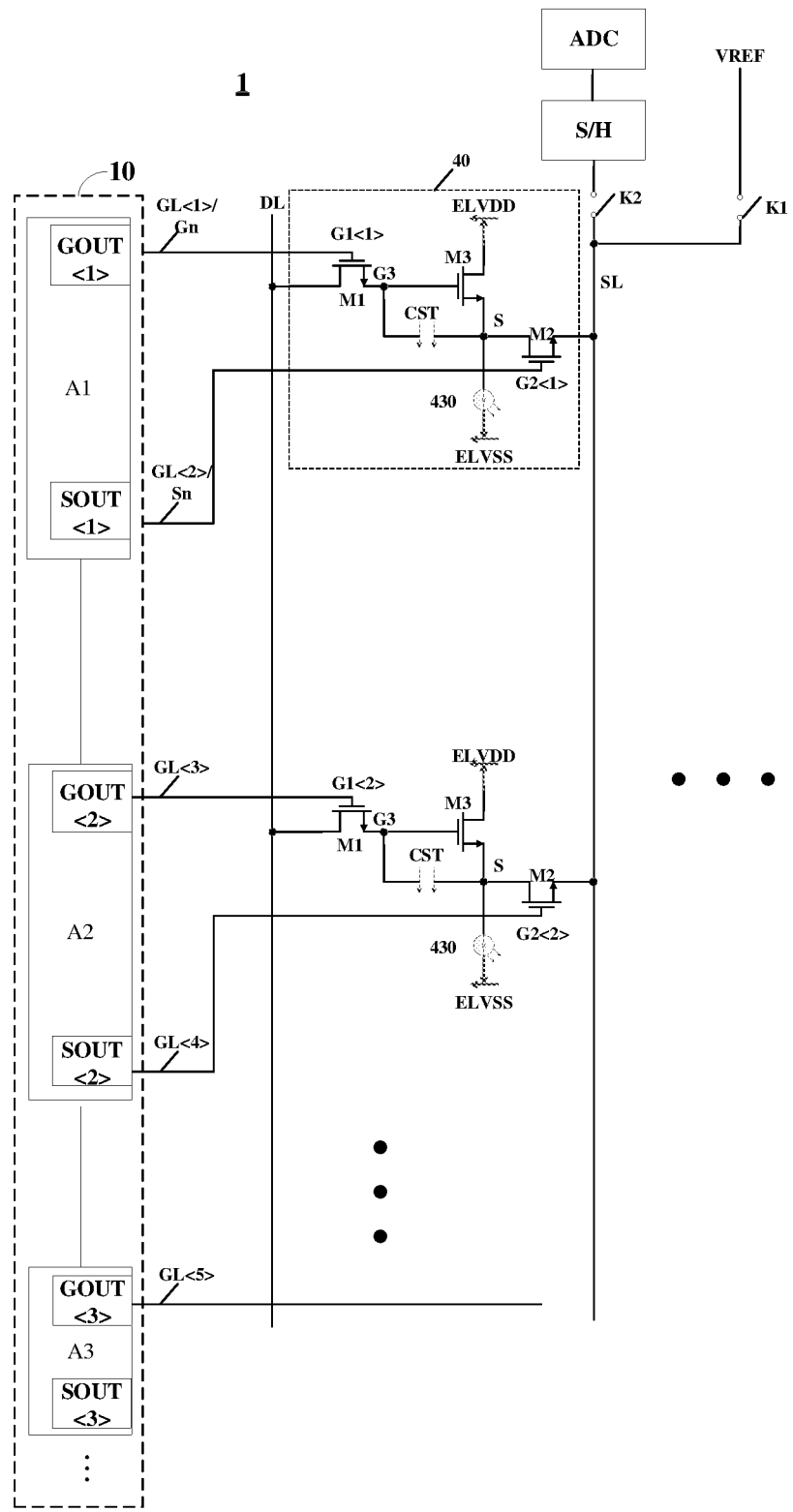
FIG. 7 is a schematic diagram of a display panel according to at least one embodiment of the present disclosure.

At least one embodiment of the present disclosure further provides a display panel. FIG. 7 is a schematic diagram of a display panel according to at least one embodiment of the present disclosure. For example, as shown in FIG. 7, the display panel 1 includes the gate driving circuit 10 provided in any embodiment of the present disclosure and pixel units 40 arranged in an array. For example, the pixel unit 40 may adopt the circuit structure shown in FIG. 1A, and for a specific introduction, reference may be made to the related descriptions in FIGS. 1A to 1C, which will not be repeated here.

FIG. 7 shows a first stage of shift register unit A1, a second stage of shift register unit A2, a third stage of shift register unit A3, etc., which are cascaded, and a first output terminal SOUT and a second output terminal GOUT of each stage of shift register unit. For example, the first output terminal SOUT<1> and the second output terminal GOUT<1> of the first stage of shift register unit A1 are connected to the gate electrode G2<1> of the sensing transistor M2 and the gate electrode G1<1> of the scan transistor M1 of the pixel unit in the first row through the gate line GL<2> and the gate line GL<1>, respectively, the first output terminal SOUT<2> and the second output terminal GOUT<2> of the second stage of shift register unit A1 are connected to the gate electrode G2<2> of the sensing transistor M2 and the gate electrode G1<2> of the scan transistor M1 of the pixel unit in the second row through the gate line GL<4> and the gate line GL<3>, respectively, and so on.

For the sake of clarity and simplicity, the coupling manner of the shift output terminal COUT is not shown in FIG. 7.

It should be noted that FIG. 7 only shows that each stage of shift register unit is only coupled with one row of pixel units 40 for driving, in the case where each stage of shift register unit includes a plurality of first output circuits, a plurality of second output circuits, and a plurality of third output circuits, one shift register unit can be coupled to a plurality of rows of pixel units 40 for driving, which may be determined by actual conditions, the embodiments of the present disclosure do not limit this, so that one shift register unit can drive at least one row of pixel circuits, and therefore, the size of the gate driving circuit can be reduced, which is beneficial to implement a narrow frame.

For example, as shown in FIGS. 1A and 7, the pixel unit 40 includes a sensing circuit (the sensing circuit 420 shown in FIG. 1A, which is implemented as a sensing transistor M2) and a light-emitting element 430. For example, at least one first output terminal SOUT of the second output circuit 132 of the shift register unit 100 is coupled to the sensing circuit 420 of at least one row of pixel units corresponding thereto, so that the sensing circuit 420 performs a sensing operation in response to the first output signal, for example, sensing a voltage or current signal at the first electrode of the light-emitting element 430.

For example, as shown in FIG. 1A and FIG. 7, the pixel unit 40 further includes a driving circuit 412, in the case where the shift register unit 100 further includes a third output circuit 133, the third output circuit 133 is coupled to the first node Q1 and at least one second output terminal GOUT, and is configured to, under control of the level of the first node Q1, output a second output signal at the second output terminal GOUT when the first output terminal SOUT outputs a first sub-pulse of the plurality of sub-pulses, the at least one second output terminal GOUT of the third output circuit 133 of the shift register unit 100 is coupled to a driving circuit 412 of at least one row of the pixel units 40 corresponding thereto, so that the driving circuit 412 controls a current flowing through the light-emitting element 430 in response to the second output signal.

For example, for the specific control principle of the pixel unit, reference may be made to the description of FIG. 1A to FIG. 1C and related introductions in the art, and details are not repeated here.

For example, the display panel 1 may further include a data driving circuit (not shown in the figure). The data driving circuit is coupled to the data lines DL for providing data signals to the pixel array; the gate driving circuit 10 is used to provide driving signals (e.g., scan driving signals and sensing driving signals) to the pixel array, for example, the driving signal can drive the data writing transistor and the sensing transistor in the pixel unit 40. The data driving circuit is electrically coupled to the pixel unit 40 through the data line DL, and the gate driving circuit 10 is electrically coupled to the pixel unit 40 through the gate line GL.

It should be noted that the display panel 1 in the embodiment can be any product or component with a display function, such as a liquid crystal panel, a liquid crystal TV, a display, an OLED panel, an OLED TV, an electronic paper display panel, a mobile phone, a tablet computer, a notebook computer, a digital photo frame, and a navigator. The display panel 1 may also include other conventional components, and the embodiments of the present disclosure are not limited to this case.

For the technical effect of the display panel 1 provided by the embodiments of the present disclosure, reference may be made to the corresponding descriptions of the shift register unit 100 in the above-mentioned embodiments, which will not be repeated here.

It should be noted that, for the sake of clarity and conciseness, the entire structure of the display panel 1 is not given. In order to achieve the necessary functions of the display panel, those skilled in the art can set other structures not shown according to specific application scenarios, and the embodiments of the present disclosure are not limited to this case.

Embodiments of the present disclosure also provide a driving method, which can be used to drive the shift register unit 100 provided by the embodiments of the present disclosure. For example, in an example, the driving method includes: applying the first input signal to the input circuit 110, so that the input circuit 110 controls the level of the first node Q1 in response to the first input signal; applying the reset signal to the reset circuit 120, so that the reset circuit 120 resets the first node Q1 in response to the reset signal; under control of the level of the first node Q1, the first output circuit 131 outputting the shift signal at the at least one shift output terminal COUT; and in the first phase, under control of the level of the first node Q1, the second output circuit 132 outputting the plurality of sub-pulses at the first output terminal SOUT as the first output signal when the shift output terminal COUT outputs the first level of the shift signal.

For example, in other examples, the driving method further includes: in a second phase different from the first phase, under control of the level of the first node Q1, the second output circuit 132 outputting a pulse signal or an invalid signal at the first output terminal SOUT as the first output signal when the shift output terminal SOUT outputs the first level of the shift signal.

For example, in other examples, the driving method of the shift register unit 100 includes a plurality of first phases, and the driving method further includes: in an n-th first phase, under control of the level of the first node Q1, the second output circuit 132 outputting a plurality of sub-pulses at the first output terminal SOUT as the first output signal when the shift output terminal COUT outputs the first level of the shift signal; in an m-th first phase, under control of the level of the first node Q1, the second output circuit 132 outputting a plurality of sub-pulses at the first output terminal SOUT as the first output signal when the shift output terminal COUT outputs the first level of the shift signal. For example, the number of the plurality of sub-pulses output in the n-th first phase is different from the number of the plurality of sub-pulses output in the m-th first phase; n is an integer greater than or equal to 1 and m is an integer greater than or equal to 1.

For the technical effect of the driving method of the shift register unit 100 provided by the embodiments of the present disclosure, reference may be made to the corresponding description of the shift register unit in the above-mentioned embodiments, which will not be repeated here.

The following should be noted:
(1) Only the structures involved in the embodiments of the present disclosure are illustrated in the drawings of the embodiments of the present disclosure, and other structures can refer to usual designs;
(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A shift register unit, comprising: an input circuit, a reset circuit, a first output circuit, a second output circuit, and a third output circuit;
wherein the input circuit is coupled to a first node and is configured to control a level of the first node in response to a first input signal;
the reset circuit is coupled to the first node and a reset terminal, and is configured to reset the first node in response to a reset signal provided by the reset terminal;
the first output circuit is coupled to the first node and at least one shift output terminal, and is configured to output a shift signal at the shift output terminal under control of the level of the first node; and
the second output circuit is coupled to the first node and at least one first output terminal, and is configured to, in a first phase, under control of the level of the first node, output a plurality of sub-pulses at the first output terminal as a first output signal in a case where the shift output terminal outputs a first level of the shift signal, wherein the first phase is a sensing phase;
the third output circuit is coupled to the first node and at least one second output terminal, and is configured to, under control of the level of the first node, output a second output signal at the second output terminal in a case where the first output terminal outputs a first sub-pulse of the plurality of sub-pulses; and
wherein a pulse width of the second output signal is identical with a pulse width of a single sub-pulse of the first output signal.

2. The shift register unit according to claim 1, wherein the second output circuit is further configured to, in a second phase different from the first phase, under control of the level of the first node, output a pulse signal or an invalid signal at the first output terminal as the first output signal in a case where the shift output terminal outputs the first level of the shift signal.

3. The shift register unit according to claim 2, wherein a pulse width of the pulse signal is identical with a width of the first level of the shift signal.

4. The shift register unit according to claim 3, further comprising a third output circuit,
wherein the third output circuit is coupled to the first node and at least one second output terminal, and is configured to, under control of the level of the first node, output a second output signal at the second output terminal in a case where the first output terminal outputs a first sub-pulse of the plurality of sub-pulses.

5. The shift register unit according to claim 2, wherein in the third output circuit is further configured to, in the second phase, under control of the level of the first node, output a pulse signal at the second output terminal as the second output signal in a case where the shift output terminal outputs the first level of the shift signal.

6. The shift register unit according to claim 5, wherein in a case of comprising one shift output terminal, the first output circuit comprises:
a first transistor, wherein a gate electrode of the first transistor is coupled to the first node, a first electrode of the first transistor is coupled to a first clock signal terminal to receive a first clock signal, and a second electrode of the first transistor is coupled to the shift output terminal; and
a first capacitor, wherein a first electrode of the first capacitor is coupled to the first node, and a second electrode of the first capacitor is coupled to the shift output terminal.

7. The shift register unit according to claim 2, wherein in a case of comprising one first output terminal, the second output circuit comprises:
a second transistor, wherein a gate electrode of the second transistor is coupled to the first node, a first electrode of the second transistor is coupled to a second clock signal terminal to receive a second clock signal, and a second electrode of the second transistor is coupled to the first output terminal; and
a second capacitor, wherein a first electrode of the second capacitor is coupled to the first node, and a second electrode of the second capacitor is coupled to the first output terminal.

8. The shift register unit according to claim 7, wherein each cycle of the second clock signal comprises a first period corresponding to the first level of the shift signal and a second period corresponding to a second level of the shift signal;
in the first phase, the first period comprises the plurality of sub-pulses, and in the second phase, the first period comprises a pulse signal or an invalid signal; and
a level at the second period remains unchanged.

9. The shift register unit according to claim 2, wherein in a case of comprising one second output terminal, the third output circuit comprises:
a third transistor, wherein a gate electrode of the third transistor is coupled to the first node, a first electrode of the third transistor is coupled to a third clock signal terminal to receive a third clock signal, and a second electrode of the third transistors is coupled to the second output terminal; and
a third capacitor, wherein a first electrode of the third capacitor is coupled to the first node, and a second electrode of the third capacitor is coupled to the second output terminal.

10. The shift register unit according to claim 9, wherein in the first phase, a pulse width of each cycle of the third clock signal is identical with a width of a single sub-pulse of the plurality of sub-pulses; and
in the second phase, a pulse width of each cycle of the third clock signal is identical with a pulse width of the shift signal.

11. The shift register unit according to claim 1, wherein in a case of comprising one shift output terminal, the first output circuit comprises:

a first transistor, wherein a gate electrode of the first transistor is coupled to the first node, a first electrode of the first transistor is coupled to a first clock signal terminal to receive a first clock signal, and a second electrode of the first transistor is coupled to the shift output terminal; and a first capacitor, wherein a first electrode of the first capacitor is coupled to the first node, and a second electrode of the first capacitor is coupled to the shift output terminal.

12. A gate driving circuit, comprising the shift register unit according to claim 1.

13. A display panel, comprising the gate driving circuit according to claim 12 and pixel units arranged in an array, wherein each pixel unit comprises a sensing circuit and a light-emitting element, the at least one first output terminal of the second output circuit of the shift register unit is coupled to a sensing circuit of at least one row of the pixel units corresponding the at least one first output terminal, so that the sensing circuit performs a sensing operation in response to the first output signal.

14. The display panel according to claim 13, wherein each pixel unit further comprises a driving circuit, in a case where the shift register unit further comprises a third output circuit, the third output circuit is coupled to the first node and at least one second output terminal, and is configured to, under control of the level of the first node, output a second output signal at the second output terminal in a case where the first output terminal outputs a first sub-pulse of the plurality of sub-pulses; and the at least one second output terminal of the third output circuit of the shift register unit is coupled to a driving circuit of at least one row of the pixel units corresponding the at least one second output terminal, so that the driving circuit controls a current flowing through the light-emitting element in response to the second output signal.

15. A driving method for the shift register unit according to claim 1, comprising:

applying the first input signal to the input circuit, so that the input circuit controls the level of the first node in response to the first input signal;

applying the reset signal to the reset circuit, so that the reset circuit resets the first node in response to the reset signal;

under control of the level of the first node, the first output circuit outputting the shift signal at the at least one shift output terminal; and in the first phase, under control of the level of the first node, the second output circuit outputting the plurality of sub-pulses at the first output terminal as the first output signal in the case where the shift output terminal outputs the first level of the shift signal.

16. The driving method for the shift register unit according to claim 15, further comprising:

in a second phase different from the first phase, under control of the level of the first node, the second output circuit outputting a pulse signal or an invalid signal at the first output terminal as the first output signal in a case where the shift output terminal outputs the first level of the shift signal.

17. The driving method for the shift register unit according to claim 15, comprising a plurality of first phases, wherein the driving method further comprises:

in an n-th first phase, under control of the level of the first node, the second output circuit outputting a plurality of sub-pulses at the first output terminal as the first output signal in a case where the shift output terminal outputs the first level of the shift signal; and in an m-th first phase, under control of the level of the first node, the second output circuit outputting a plurality of sub-pulses at the first output terminal as the first output signal in a case where the shift output terminal outputs the first level of the shift signal, wherein a count of the plurality of sub-pulses output in the n-th first phase is different from a count of the plurality of sub-pulses output in the m-th first phase, where n is an integer greater than or equal to 1 and m is an integer greater than or equal to 1.

* * * * *